US 8,127,192 B2

(12) United States Patent
Arora et al.

(10) Patent No.: US 8,127,192 B2
(45) Date of Patent: Feb. 28, 2012

(54) PREDICTING LWARX AND STWCX INSTRUCTIONS IN TEST PATTERN GENERATION AND SIMULATION FOR PROCESSOR DESIGN VERIFICATION/VALIDATION IN INTERRUPT MODE

(75) Inventors: Sampan Arora, Bangalore (IN); Divya S. Anvekar, Bangalore (IN); Manoj Dusanapudi, Bangalore (IN); Sunil Suresh Hatti, Gokul (IN); Shakti Kapoor, Austin, TX (US); Bhavani Shringari Nanjundiah, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 822 days.

(21) Appl. No.: 12/172,628

(22) Filed: Jul. 14, 2008

(65) Prior Publication Data

US 2009/0024894 A1    Jan. 22, 2009

Related U.S. Application Data

(63) Continuation-in-part of application No. 11/779,390, filed on Jul. 18, 2007, now Pat. No. 7,689,886.

(51) Int. Cl.
*G01R 31/28* (2006.01)
*G06F 11/00* (2006.01)

(52) U.S. Cl. ...................................................... 714/739

(58) Field of Classification Search .......... 714/738–739, 714/741–743, 728, 726, 10–11, 31
See application file for complete search history.

(56) References Cited

U.S. PATENT DOCUMENTS

| 5,355,471 | A | 10/1994 | Weight | 714/10 |
|---|---|---|---|---|
| 5,502,732 | A | 3/1996 | Arroyo et al. | 714/746 |
| 5,831,997 | A | 11/1998 | Kodashiro | 714/738 |
| 5,938,777 | A | 8/1999 | Carter | 714/32 |
| 5,956,478 | A | 9/1999 | Huggins | 714/33 |
| 5,996,034 | A | 11/1999 | Carter | 710/100 |
| 6,275,752 | B1 | 8/2001 | Giers | 701/29 |
| 6,502,212 | B1 | 12/2002 | Coyle et al. | 714/43 |
| 6,769,083 | B1 | 7/2004 | Tsuto et al. | 714/738 |
| 6,820,219 | B1 | 11/2004 | Huang et al. | 714/25 |
| 6,907,548 | B2 | 6/2005 | Abdo | 714/43 |
| 7,020,811 | B2 | 3/2006 | Byrd | 714/703 |
| 7,137,055 | B2 | 11/2006 | Hirano et al. | 714/738 |
| 7,159,144 | B2* | 1/2007 | Babu et al. | 714/35 |
| 7,334,159 | B1 | 2/2008 | Callaghan | 714/30 |
| 7,359,822 | B2 | 4/2008 | Fujiwara et al. | |
| 7,437,262 | B2 | 10/2008 | Boose et al. | 702/122 |

(Continued)

OTHER PUBLICATIONS

Notice of allowance for co-pending U.S. Appl. No. 11/779,383, mailed Feb. 19, 2010, 12 pages.

(Continued)

*Primary Examiner* — Christine Tu
(74) *Attorney, Agent, or Firm* — VanLeeuwen & VanLeeuwen; Matthew B. Talpis

(57) ABSTRACT

During a test pattern build, a test pattern generator pseudo-randomly selects an address for a selected lwarx instruction and builds the lwarx instruction using the pseudo-random address into a test pattern. Subsequently, the test pattern generator builds a store instruction after the lwarx instruction using the pseudo-random address. The store instruction is adapted to store the pseudo-random address in a predetermined memory location. The test pattern generator also builds an interrupt service routine that services an interrupt associated with the interrupt request; checks the predetermined memory location; determines that the pseudo-random address is located in the predetermined memory location; and executes a subsequent lwarx instruction using the pseudo-random address.

20 Claims, 26 Drawing Sheets

U.S. PATENT DOCUMENTS

| | | | |
|---|---|---|---|
| 7,584,394 B2 * | 9/2009 | Choudhury et al. | 714/738 |
| 7,590,910 B2 * | 9/2009 | Haroun et al. | 714/727 |
| 7,689,886 B2 * | 3/2010 | Arora et al. | 714/738 |
| 2003/0149916 A1 | 8/2003 | Ohtake et al. | 714/33 |
| 2004/0111656 A1 | 6/2004 | Hayden et al. | 714/719 |
| 2004/0153799 A1 | 8/2004 | Maneparambil et al. | 714/30 |
| 2005/0166116 A1 | 7/2005 | Ramsey | 714/741 |
| 2006/0005096 A1 | 1/2006 | Cullen et al. | 714/742 |
| 2006/0031641 A1 | 2/2006 | Hataida et al. | 711/144 |
| 2006/0155897 A1 | 7/2006 | Kehne et al. | 710/55 |
| 2007/0186054 A1 | 8/2007 | Kruckemyer et al. | 711/144 |
| 2008/0228966 A1 | 9/2008 | Kehne et al. | 710/52 |
| 2008/0244231 A1 | 10/2008 | Kunze et al. | 712/207 |
| 2008/0244250 A1 | 10/2008 | Swanson et al. | 713/1 |
| 2008/0288725 A1 | 11/2008 | Moyer et al. | 711/146 |
| 2009/0006764 A1 | 1/2009 | Blumrich et al. | 711/141 |
| 2009/0024876 A1 | 1/2009 | Arora et al. | 714/42 |
| 2009/0024877 A1 | 1/2009 | Choudhury et al. | 714/43 |
| 2009/0024886 A1 | 1/2009 | Arora et al. | 714/720 |
| 2009/0024891 A1 | 1/2009 | Choudhury et al. | 714/738 |
| 2009/0024892 A1 | 1/2009 | Bussa et al. | 714/738 |
| 2009/0024894 A1 | 1/2009 | Arora et al. | 714/739 |
| 2009/0138681 A1 | 5/2009 | Saha | 712/216 |

OTHER PUBLICATIONS

Notice of allowance for co-pending U.S. Appl. No. 11/779,394, mailed Apr. 24, 2009, 8 pages.

Office Action for co-pending U.S. Appl. No. 11/779,395, mailed Apr. 21, 2009, 10 pages.

Notice of Allowance for U.S. Appl. No. 11/779,378, mailed Sep. 25, 2009, 10 pages.

Non-final Office Action for U.S. Appl. No. 11/779,385, mailed Sep. 28, 2009, 9 pages.

* cited by examiner

Table 2000

| | | | 2010 | 2020 | 2030 | 2040 |
|---|---|---|---|---|---|---|
| | | | TP A | TP B | TP C | TP D |
| | | | Processor B 2005 | | | |
| | | Processor B 2005 | | | |
| 2050 | TP A | Processor A 2045 | TP <A,A><br>TLB <A,A><br>L1 <A,A><br>L2 <A,A><br>BUS <A,A> | TP <A,B><br>TLB <A,B><br>L1 <A,B><br>L2 <A,B><br>BUS <A,B> | TP <A,C><br>TLB <A,C><br>L1 <A,C><br>L2 <A,C><br>BUS <A,C> | TP <A,D><br>TLB <A,D><br>L1 <A,D><br>L2 <A,D><br>BUS <A,D> |
| 2060 | TP B | | TP <B,A><br>TLB <B,A><br>L1 <B,A><br>L2 <B,A><br>BUS <B,A> | TP <B,B><br>TLB <B,B><br>L1 <B,B><br>L2 <B,B><br>BUS <B,B> | TP <B,C><br>TLB <B,C><br>L1 <B,C><br>L2 <B,C><br>BUS <B,C> | TP <B,D><br>TLB <B,D><br>L1 <B,D><br>L2 <B,D><br>BUS <B,D> |
| 2070 | TP C | | TP <C,A><br>TLB <C,A><br>L1 <C,A><br>L2 <C,A><br>BUS <C,A> | TP <C,B><br>TLB <C,B><br>L1 <C,B><br>L2 <C,B><br>BUS <C,B> | TP <C,C><br>TLB <C,C><br>L1 <C,C><br>L2 <C,C><br>BUS <C,C> | TP <C,D><br>TLB <C,D><br>L1 <C,D><br>L2 <C,D><br>BUS <C,D> |
| 2080 | TP D | | TP <D,A><br>TLB <D,A><br>L1 <D,A><br>L2 <D,A><br>BUS <D,A> | TP <D,B><br>TLB <D,B><br>L1 <D,B><br>L2 <D,B><br>BUS <D,B> | TP <D,C><br>TLB <D,C><br>L1 <D,C><br>L2 <D,C><br>BUS <D,C> | TP <D,D><br>TLB <D,D><br>L1 <D,D><br>L2 <D,D><br>BUS <D,D> |

FIG. 20

PREDICTING LWARX AND STWCX INSTRUCTIONS IN TEST PATTERN GENERATION AND SIMULATION FOR PROCESSOR DESIGN VERIFICATION/VALIDATION IN INTERRUPT MODE

RELATED APPLICATION

This application is a continuation-in-part of application Ser. No. 11/779,390 filed Jul. 18, 2007, titled "System and Method for Predicting lwarx and stwcx Instructions in Test Pattern Generation and Simulation for Processor Design Verification and Validation," and having the same inventors as the above-referenced application.

BACKGROUND OF THE INVENTION

1. Technical Field

The present invention relates to a system and method for building a test pattern that restores a lwarx (Load Word And Reserve Index form) reservation after an interrupt. More particularly, the present invention relates to a system and method for checking a predetermined memory location after servicing an interrupt and restoring the lwarx reservation when the predetermined memory location includes a reservation address.

2. Description of the Related Art

Lwarx and stwcx instructions are instruction pairs that reserve an address (lwarx) and store data to the reserved address (stwcx) when the reservation still exists. Lwarx-initiated reservations may be lost due to reasons such as when an interrupt occurs between the lwarx instruction and the paired stwcx instruction. As a result, the paired stwcx instruction's result is unpredictable and, therefore, difficult to test.

SUMMARY

During a test pattern build, a test pattern generator pseudo-randomly selects an address for a selected lwarx instruction and builds the lwarx instruction using the pseudo-random address into a test pattern. Subsequently, the test pattern generator builds a store instruction after the lwarx instruction using the pseudo-random address. The store instruction is adapted to store the pseudo-random address in a predetermined memory location. The test pattern generator also builds an interrupt service routine that services an interrupt associated with the interrupt request; checks the predetermined memory location; determines that the pseudo-random address is located in the predetermined memory location; and executes a subsequent lwarx instruction using the pseudo-random address.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 20 is a table showing different test pattern execution scenarios that result in different bus contention scenarios;

DETAILED DESCRIPTION

The following is intended to provide a detailed description of an example of the invention and should not be taken to be limiting of the invention itself. Rather, any number of variations may fall within the scope of the invention, which is defined in the claims following the description.

Figure 1:
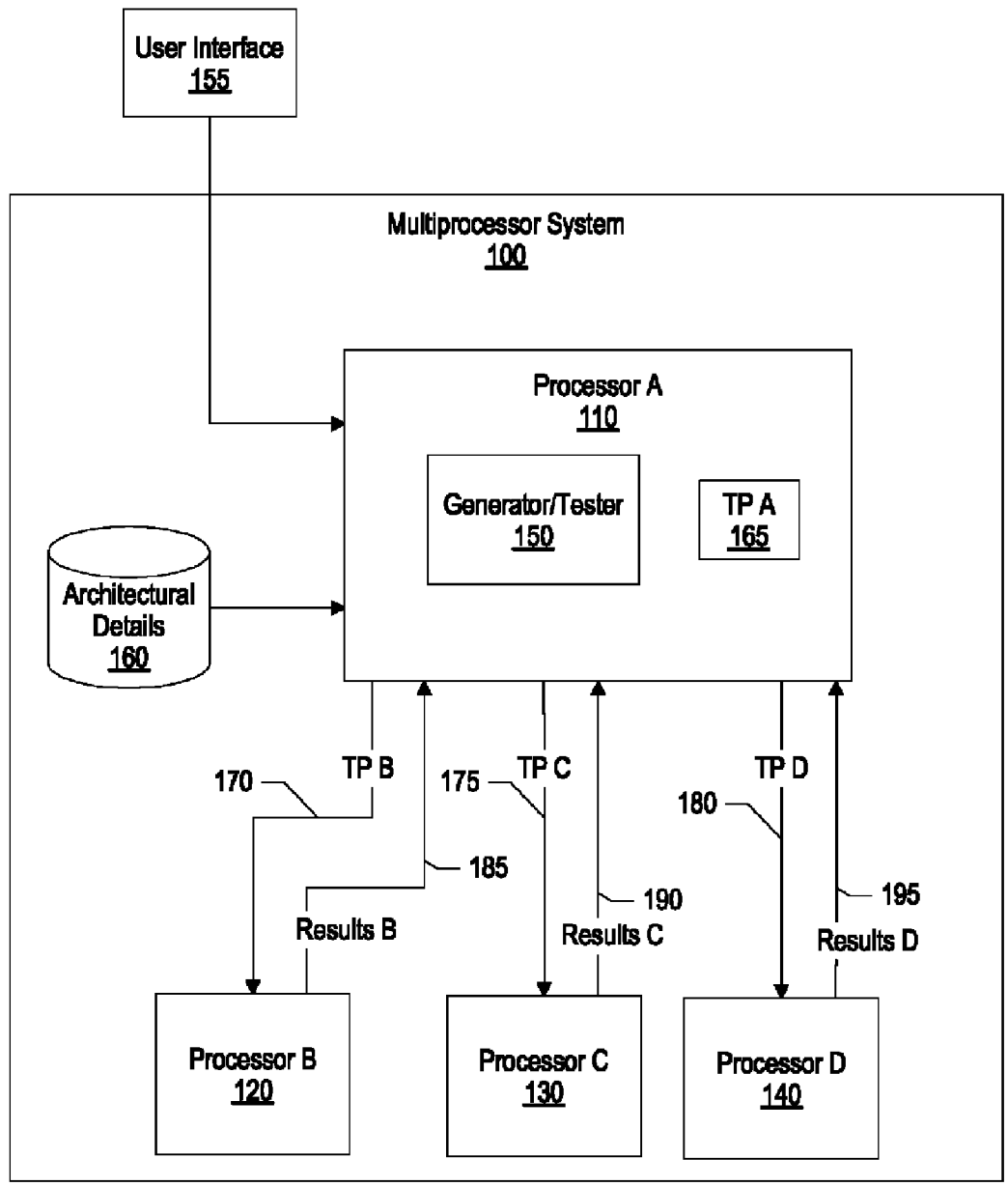
FIG. 1 is a diagram showing a multi-processor system using an onboard generator/tester for processor design verification and validation.

FIG. 1 is a diagram showing a multi-processor system using an onboard generator/tester for processor design verification and validation. Multi-processor system 100 includes processor A 110, processor B 120, processor C 130, and processor D 140. As one skilled in art can appreciate, more or less processors may be used in a multi-processor system other than the example shown in FIG. 1 for processor design verification and validation.

Processor A 110 includes generator/tester 150, which generates pseudo-random test patterns that are distributed to each processor. Generator/tester 150 receives input from user interface 155 and retrieves architectural rules from architectural details 160 in order to generate the pseudo-random test patterns (e.g., test pattern A 165, test pattern B 170, test pattern C 175, and test pattern D 180). The pseudo-random test patterns fully test multi-processor 100's memory and timing characteristics based upon the retrieved architectural rules. Architectural details 160 may be stored on a nonvolatile storage area, such as a computer hard drive.

Figure 2:
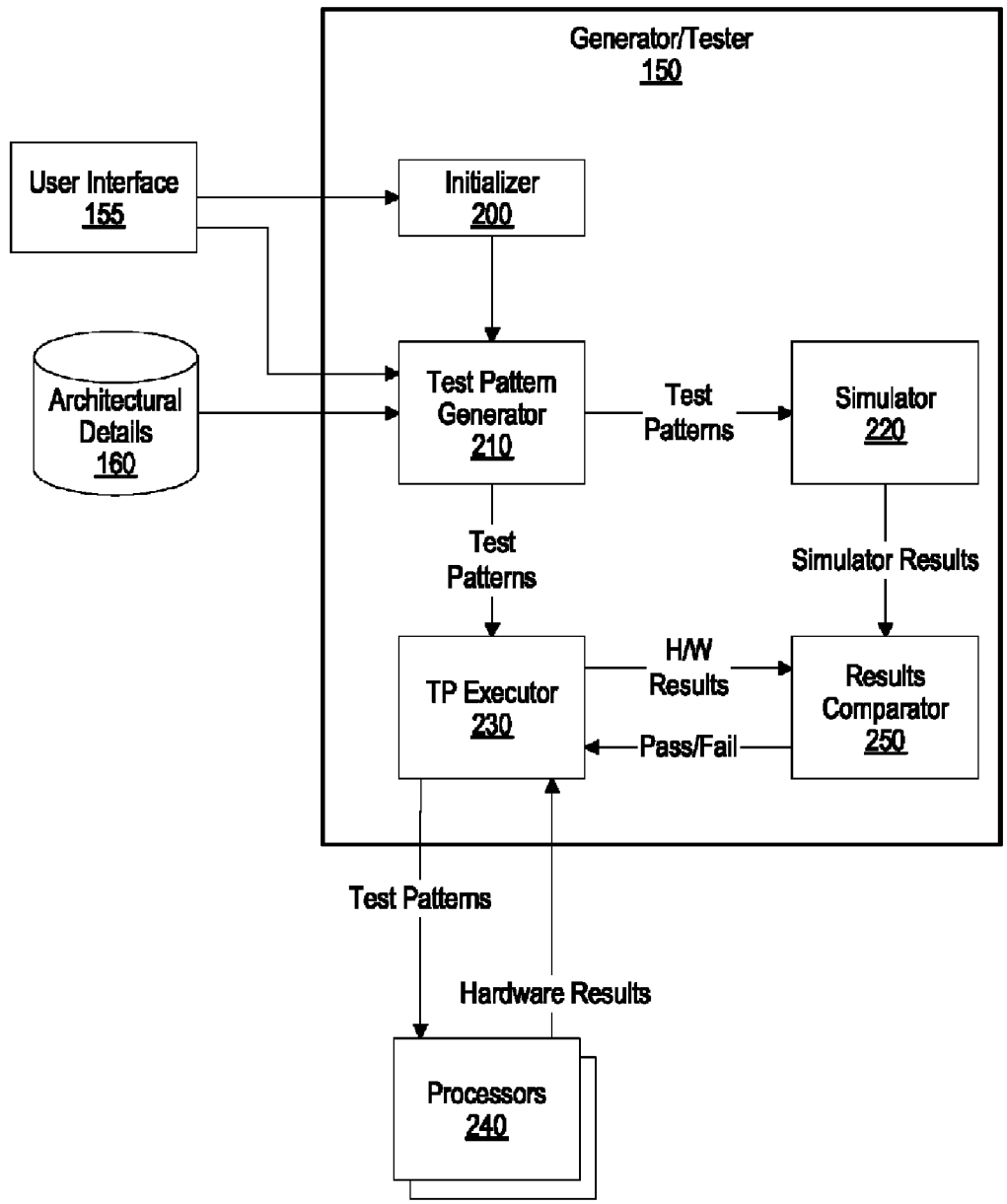
FIG. 2 is a diagram showing a generator/tester generating test patterns and comparing hardware results against simulation results during processor design verification and validation.

After the processor executes the test patterns, generator/tester 150 receives hardware results (e.g., results B 185, results C 190, and results D 195) from the processors and compares the results against simulation results in order to ensure that multi-processor system 100 operates in a manner consistent with the architectural rules (see FIG. 2 and corresponding text for further details regarding generator/tester 150).

FIG. 2 is a diagram showing a generator/tester generating test patterns and comparing hardware results against simulation results during processor design verification and validation. Generator/tester 150 includes initializer 200, test pattern generator 210, simulator 220, test pattern executor 230, and results comparator 250. User interface 155 provides user input to initializer 200 and test pattern generator 210, such as instruction types to execute, memory range, the number of instructions to build in a test pattern, etc. In turn, initializer 200 provides initialization information to test pattern generator 210. Generator/tester 150 and user interface 155 are the same as that shown in FIG. 1.

Test pattern generator 210 uses the initialization information, along with architectural rules from architectural details 160, to generate pseudo-random test patterns for a plurality of processors. Test pattern generator 210 provides the test patterns to simulator 220 and test pattern executor 230. Test pattern executor 230 dispatches the test patterns to processors 240 that, in turn, execute the test patterns. Processors 240 then provide hardware results back to test pattern executor 230. Architectural details 160 is the same as that shown in FIG. 1.

Test pattern executor 230 provides the hardware results to results comparator 250, which compares the hardware results with simulation results generated by simulator 220. Results comparator 250 then informs test pattern executor 230 as to whether the hardware results match the simulation results. In turn, test pattern executor 230 dispatches more test patterns to processor 240 accordingly. In one embodiment, test pattern executor 230 resides on processors 240 (see FIG. 3 and corresponding text for further details). In another embodiment, results comparator 250 resides within test pattern executor 230 (see FIG. 5 and corresponding text for further details). In these embodiments, the functions that test pattern executor 230 and results comparator 250 perform are similar to their functions described above.

Figure 3:
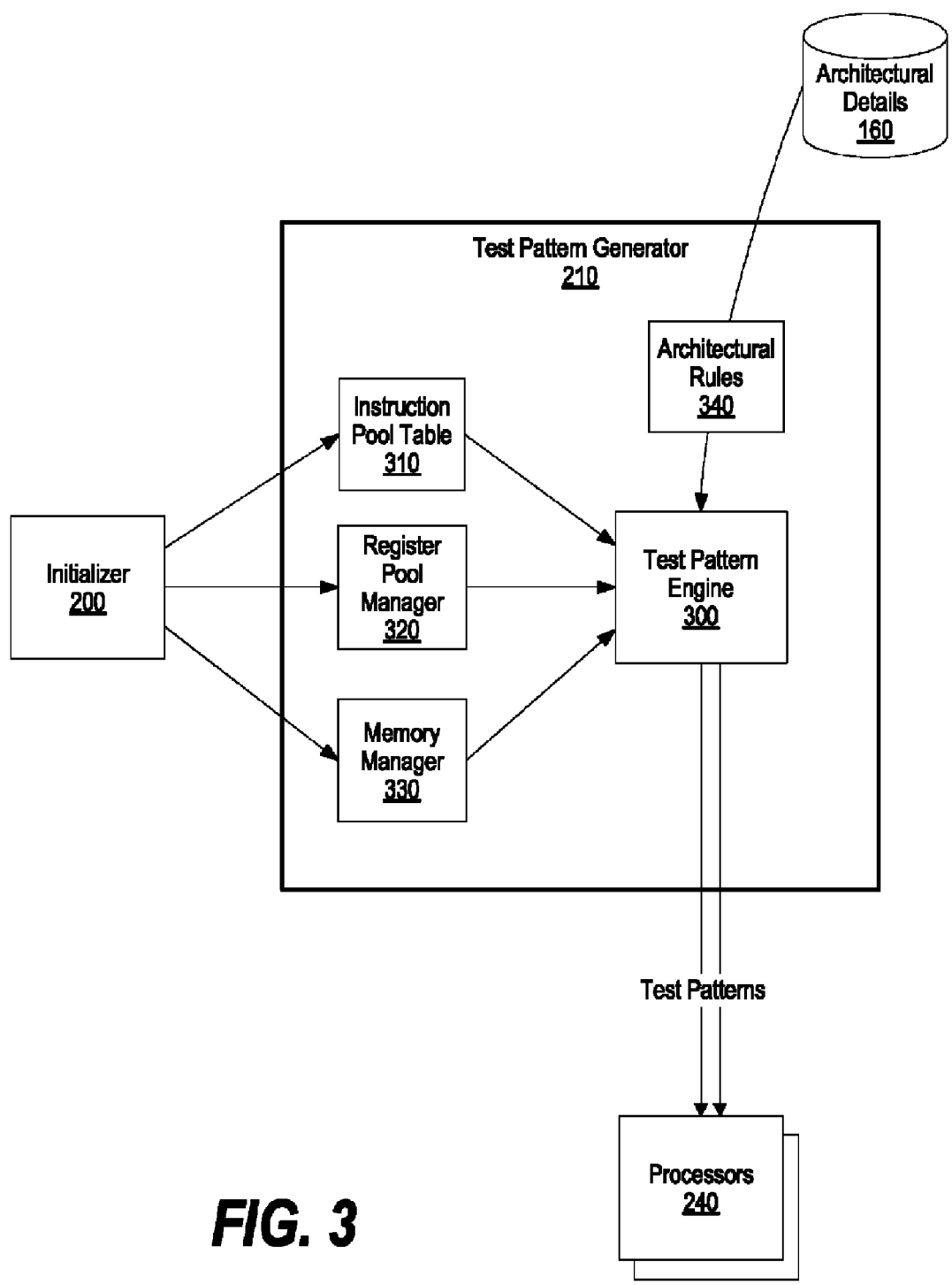
FIG. 3 is a diagram showing a test pattern generator generating test patterns based upon architectural rules and initialization information.

FIG. 3 is a diagram showing a test pattern generator generating test patterns based upon architectural rules and initialization information. Initializer 200 provides initialization information to test pattern generator 210, which stores the initialization information in instruction pool table 310, register pool manager 320, and memory manager 330. Instruction pool table 310 includes information such as a table of different instruction classes such as VMX instructions, floating point instructions, fixed point instructions, load/store instructions, etc. Register pool manager 320 includes tables such as general purpose registers (GPR), special purpose registers (SPR), hardware implementation registers (HID), etc. And, memory manager 330 includes memory pages described by hash tables, page data structures, allocation rules, etc. Test pattern engine 300 uses the initialization information, along with architectural rules 340 retrieved from architectural details 160, to generate pseudo-random test patterns that are provided to processors 240. Architectural details 160, initializer 200, and test pattern generator 210 are the same as that shown in FIG. 2.

Figure 4A:
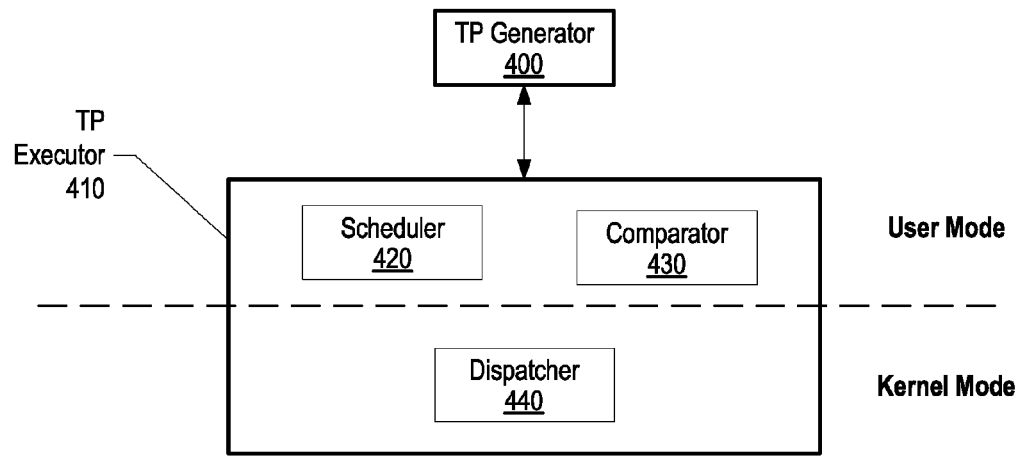
FIG. 4A is a diagram showing a general operating system execution mode that comprises a user mode and a kernel mode.

FIG. 4A is a diagram showing a general operating system execution mode that comprises a user mode and a kernel mode. When an operating system performs design verification and validation tasks, test pattern generator 400 and a portion of test pattern executor 410 (scheduler 420 and comparator 430) function in the user mode, while the remaining portion of test pattern executor 410 (dispatcher 440) functions in the kernel mode to dispatch test patterns. This results in longer test time due to the context switch required from user mode to kernel mode.

Figure 4B:
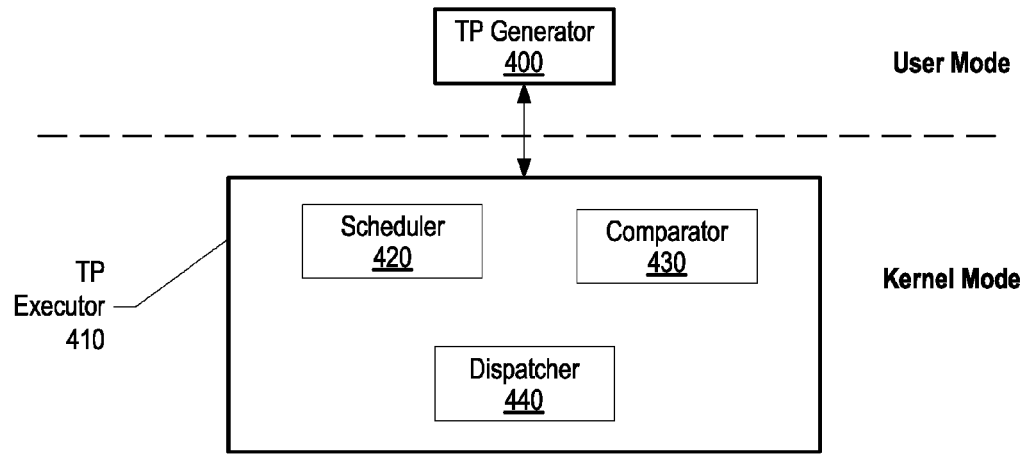
FIG. 4B is a diagram showing an innovative operating system execution mode.

FIG. 4B is a diagram showing an innovative operating system execution mode. FIG. 4B is different than FIG. 4A in that each module within test pattern executor 410 (scheduler 420, comparator 430, and dispatcher 440) operates in the kernel mode, while test pattern generator 400 operates in the user mode. By performing design verification and validation using the mode shown in FIG. 4B, the invention described herein avoids context switching between user mode and kernel mode, thus reducing overall test time.

Figure 5:
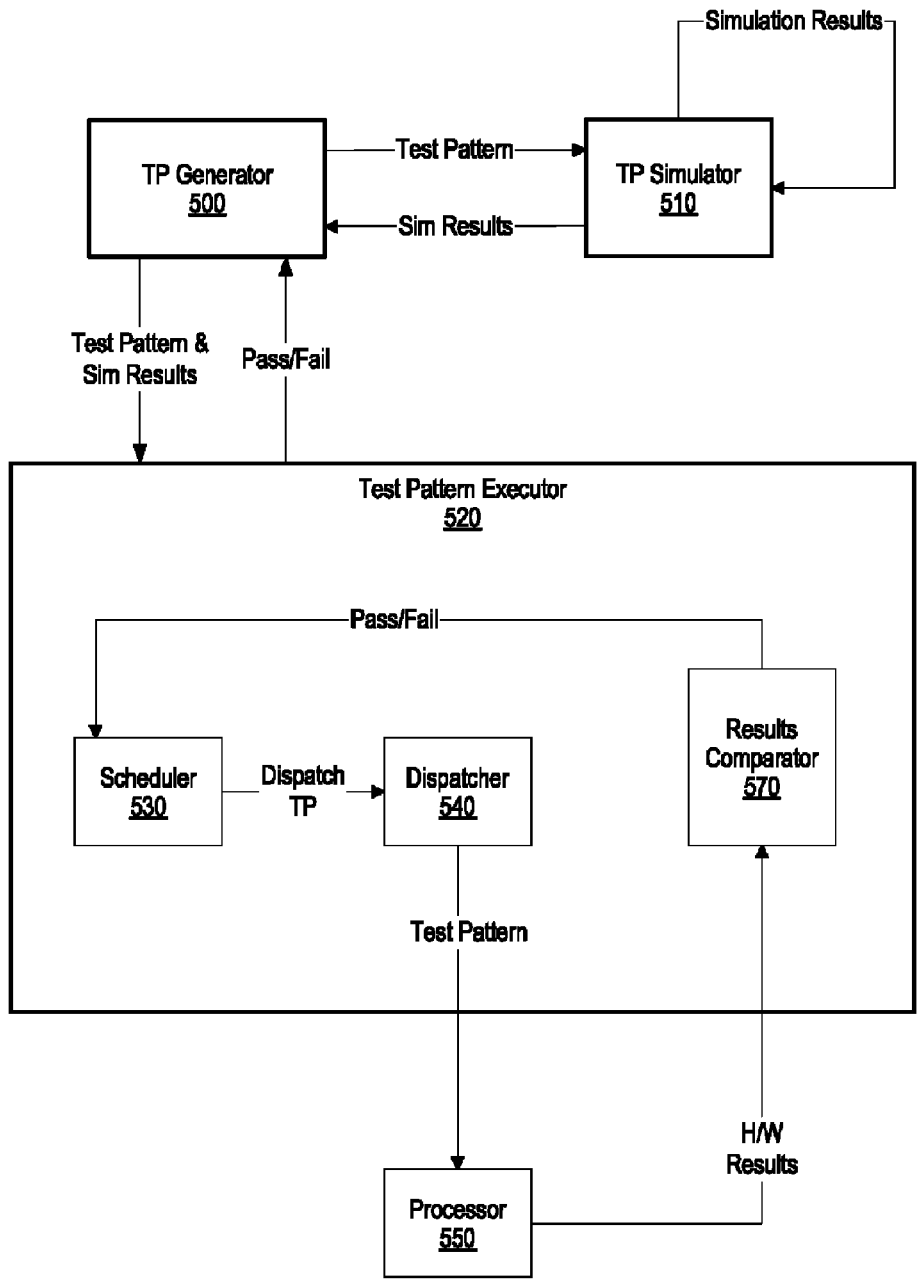
FIG. 5 is a diagram showing a test pattern generator using a test pattern simulator to execute test patterns and compute simulation error detection check values, which are subsequently passed to a test pattern executor that performs error detection checks using the simulation error detection check values and hardware error detection check values.

FIG. 5 is a diagram showing a test pattern generator using a test pattern simulator to execute test patterns and compute simulation error detection check values, such as a cyclic redundancy check (CRC), which are subsequently passed to a test pattern executor that performs error detection checks using the simulation error detection check values and hardware error detection check values. The configuration shown in FIG. 5 may be used in various embodiments, some of which are described below.

In a first embodiment, test pattern generator 500 generates one test pattern for executing a particular number of times on a processor. In this embodiment, test pattern generator 500 provides the test pattern to test pattern simulator 510 that, in turn, simulates the test pattern and returns simulation results (simulation error detection check values, such as CRC values) to test pattern generator 500. Test pattern generator 500 then provides the test pattern, along with the simulation error detection check values, to test pattern executor 520, which provides them to scheduler 530. Scheduler 530 schedules the test pattern to dispatcher 540, which dispatches the test pattern to processor 550.

Continuing with the first embodiment, processor 550 executes the test pattern and provides hardware results to results comparator 570, such as a CRC comparator. Scheduler 530 instructs results comparator 570 to compute hardware error detection check values using the hardware results, and perform an error detection check by comparing the hardware error detection check values against the simulation error detection check values. In turn, results comparator 570 provides a pass/fail indication to scheduler 530. If the comparison passes, test pattern executor 520 may re-execute the same test pattern again to ensure that the same hardware error detection check values are computed. As a result, since the test patterns themselves are not changed, overall test time is significantly reduced.

Figure 6:
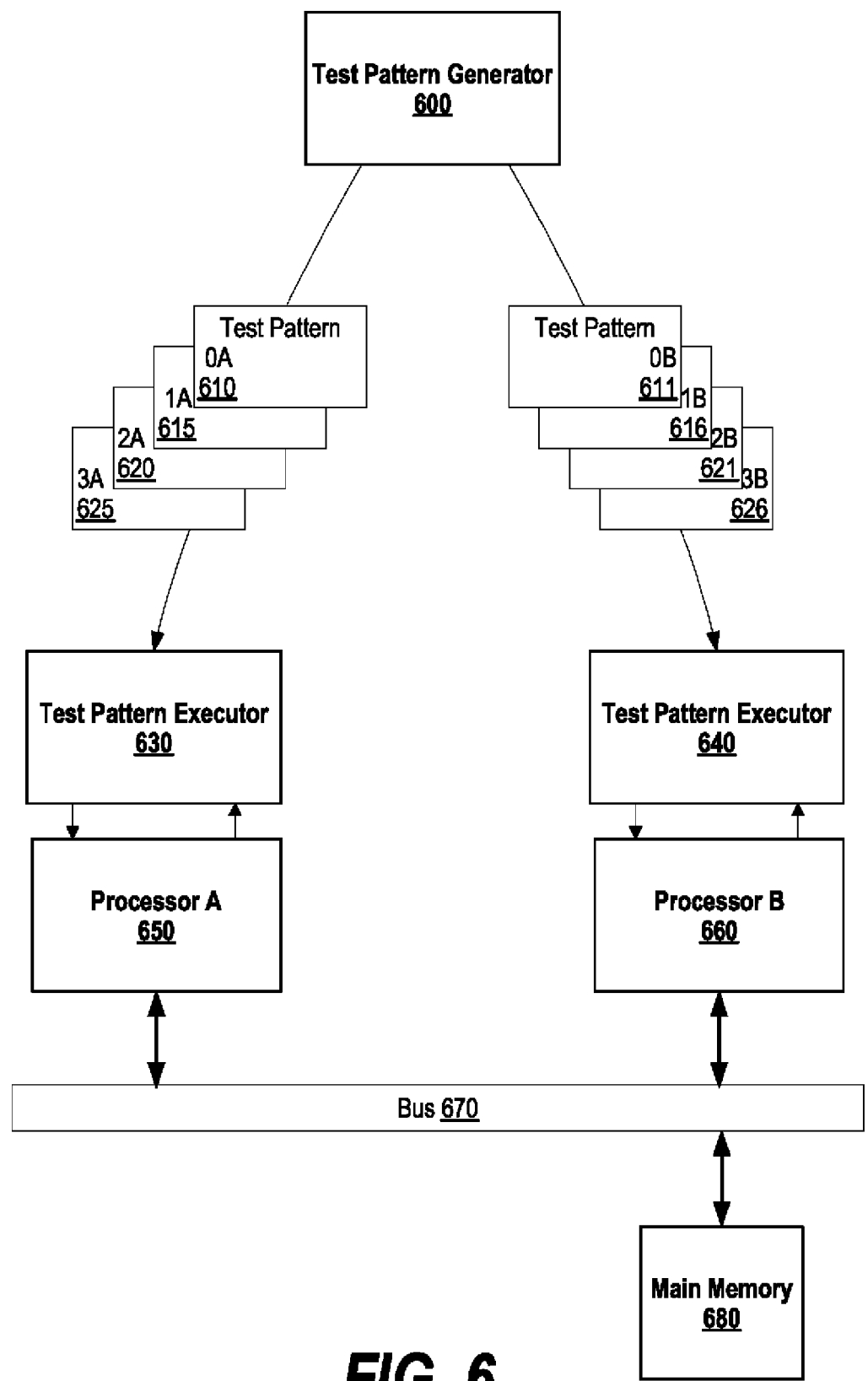
FIG. 6 is a diagram showing a test pattern generator providing "n" test patterns to a plurality of test pattern executors in order to increase overall test time throughput.
Figure 7:
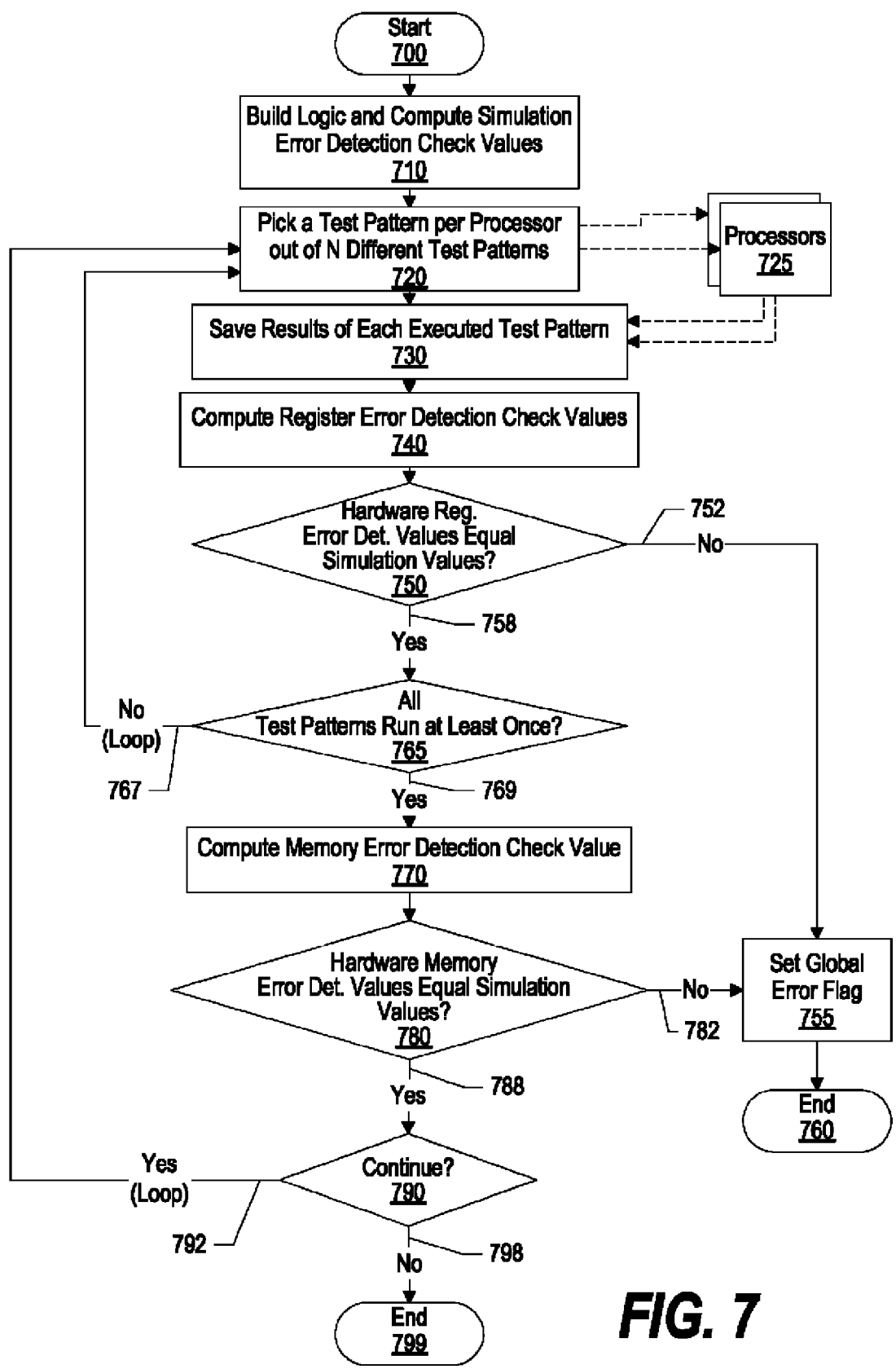
FIG. 7 is a flowchart showing steps taken in re-executing test patterns in varying timing scenarios.

In a second embodiment, test pattern generator 500 generates a set of "n" test patterns per processor for executing a particular number of times on a plurality of processors (see FIGS. 6, 7, and corresponding text for further details). In this embodiment, test pattern generator 500 provides the test patterns, for processor 550, to test pattern simulator 510 that, in turn, simulates the test patterns and returns simulation results (simulation error detection check values) to test pattern generator 500. In turn, test pattern generator 500 provides the test patterns, along with the simulation results, to test pattern executor 520, which provides them to scheduler 530. Scheduler 530 schedules one of the test patterns to dispatcher 540, which dispatches the test pattern to processor 550.

Continuing with the second embodiment, processor 550 executes the test pattern and provides hardware results to results comparator 570. Scheduler 530 instructs error detection check comparator 570 to compute a hardware register error detection check value using the hardware results, and perform a register error detection check by comparing the hardware register error detection check value against the simulation register error detection check value. If the comparison passes, test pattern executor 520 determines whether each test pattern included in the set of test patterns has been executed. If not, scheduler 530 selects a different test pattern from the set of test patterns and sends the test pattern to dispatcher 540 to dispatch. Once all of the test patterns have been executed at least once, scheduler 530 instructions results comparator 570 to compare a hardware memory error detection check value against a simulation memory error detection check value. As a result, since a memory error detection check is not performed after each test pattern execution, but rather after all test patterns have executed, less time is spent performing error detection checks, which allows more time to execute test patterns.

In a third embodiment, test pattern generator 500 generates a test pattern that is independent of initial data values. In this embodiment, test pattern generator 500 provides the test pattern, along with an initial set of data values, to test pattern simulator 510. Test pattern simulator 500 simulates the test pattern and produces a simulation result (simulation error detection check values). Test pattern simulator 510 then uses the simulation results as input values for a second test pattern execution round. Test pattern simulator 510 continues to simulate the test pattern and use the test pattern's simulation results as input data values for a next simulation for a particular number of times. Finally, test pattern simulator 510 provides the simulation results of all successive simulations to test pattern generator 500.

Continuing with this embodiment, once test pattern simulator 510 has simulated the test pattern a particular number of times, test pattern generator 500 passes the test pattern, the initial data values, and the simulation results to test pattern executor. Test pattern executor 520 uses scheduler 530 and dispatcher 540 as discussed above to schedule and dispatch the test pattern to processor 550. Processor 550 executes the test pattern and provides hardware results to results comparator 570, which computes hardware error detection check values and compares them against the simulation error detection check values. If they match, scheduler 530 and dispatcher 540 dispatch the same test pattern along with the hardware results of previous executions to be used as initial data values (similar to test pattern simulator 510 above). Each execution round has a separate simulation error detection check value. This continues for the same number of times that test pattern simulator 510 re-executed the test pattern. As a result, since the same test pattern is used, less time is spent on generating test patterns, which allows more time to execute the test patterns.

In the third embodiment test pattern generator 500 ensures that the test patterns include known and predictable values since a test pattern may produce unknown values through various means. Test pattern generator 500 aborts those instructions that generate architecturally unknown results. For example, floating point arithmetic instructions may set register contents as infinity or NAN (not a number) after a few register operations. In addition, test pattern generator 500 generates test patterns in a manner such that test pattern executor 520 is not required to change translations for every test pattern execution. For example, when executing a test pattern using different initial values, real address and offsets may change in real mode, which requires a change in translation. However, test pattern generator 500 avoids the translation change by ensuring that the same page/address is targeted in real mode.

FIG. 6 is a diagram showing a test pattern generator providing "n" test patterns to a plurality of test pattern executors (each executing on separate processors) in order to increase overall test time throughput. Test pattern generator 600 provides test pattern 0A 610, test pattern 1A 615, test pattern 2A 620, and test pattern 3A 625 to test pattern executor 630 and test pattern 0B 611, test pattern 1B 616, test pattern 2B 621, and test pattern 3B 626 to test pattern executor 640. In turn, test pattern executor 630 dispatches the test patterns to processor A 650 and test pattern executor 640 dispatches the test patterns to processor B 660. During execution, processor A 650 and processor B 660 may communicate with each other, or retrieve information from main memory 680, through bus 670.

After each test pattern execution, test pattern executor 630 and test pattern executor 640 perform a register error detection check. For example, after processor A 650 executes test pattern 0A and processor B 660 executes test pattern 0B, test pattern executor 630 and test pattern executor 640 both compute a hardware register error detection check value based upon hardware results from their respective processors, and match the computed values against simulation register error detection check values (see FIG. 7 and corresponding text for further details).

Once processor A 650 finishes executing all of its corresponding test patterns at least once, and processor B 660 finishes executing all of its corresponding test patterns, test pattern executor 630 and 640 each performs a memory error detection check comparison against simulation values, and sets an error flag if the comparison values do not match (see FIG. 7 and corresponding text for further details). By waiting until all of the test patterns execute before performing a memory error detection check, verification time decreases, which increases the amount of time available for test pattern execution and, therefore, increases test coverage.

FIG. 7 is a flowchart showing steps taken in re-executing test patterns in varying timing scenarios. Processing executes a set of test patterns for each processor and waits until each test pattern included in the set of test patterns has executed before performing a memory error detection check. For example, a system may include test pattern set A and test pattern set B, which execute on processor A and processor B, respectively. In this example, each of the test pattern sets includes a number of test patterns, such as ten test patterns. Continuing with this example, processing waits until all ten test patterns included in test pattern set A have executed at least once on processor A, and all ten test patterns included in test pattern set B have executed at least once on processor B before performing a memory error detection check. As a result, less time is spent on memory error detection checks, which allows more time to execute test patterns (see FIG. 6 and corresponding text for further details). In one embodiment, processing may perform a memory error detection check after "X" executions given the condition that each test pattern has executed at least once.

Processing commences at 700, whereupon processing builds logic and computes simulation error detection check values based upon simulation results, such as simulation register error detection check values and simulation memory error detection check values (step 710). For example, the simulation error detection check values may be computed using a cyclic redundancy check (CRC). At step 720, processing selects a test pattern from a corresponding test pattern set to be executed on each processor (test pattern 0A for processor A and test pattern 0B for processor B). Processors 725 execute the selected test patterns, and processing saves the execution results at step 730.

Next, processing computes a hardware register error detection check value (e.g., CRC value) for each of processors 725 based upon their execution results (step 740), and a determination is made as to whether the hardware register error detection check values equal the simulation register error detection check values (decision 750). If the hardware register error detection check values do not equal the simulation register error detection check values, decision 750 branches to "No" branch 752 whereupon processing sets a global error flag (step 755) and ends at 760.

On the other hand, if the hardware register error detection check values equal the simulation register error detection check values, decision 750 branches to "Yes" branch 758 whereupon a determination is made as to whether all of the test patterns included in each test pattern set have executed at least once on their respective processors (decision 765). If all of the test patterns have not executed at least once, decision 765 branches to "No" branch 767, which loops back to select another test pattern. This looping continues until all test patterns included in each test pattern set have executed at least once on their respective processors, at which point decision 765 branches to "Yes" branch 769 whereupon processing computes a hardware memory error detection check value (e.g. CRC value) at step 770.

A determination is made as to whether the hardware memory error detection check value matches the simulation memory detection check value (decision 780). If the hardware memory error detection check value does not match the simulation memory detection check value, decision 780 branches to "No" branch 782 whereupon processing sets a global error flag at step 755, and ends at 760. On the other hand, if the hardware memory error detection check value matches the simulation memory detection check value, decision 780 branches to "Yes" branch 788.

A determination is made as to whether to continue processor verification at decision 790. For example, system verification may require each test pattern set to execute 100 times on its respective processor. If processor verification is to continue, decision 790 branches to "Yes" branch 792, which loops back to step 720, whereupon a test pattern from each of the test pattern sets is selected to execute on its respective processor. This looping continues until processor verification should terminate, at which point decision 790 branches to "No" branch 798 whereupon processing ends at 799.

Figure 8:
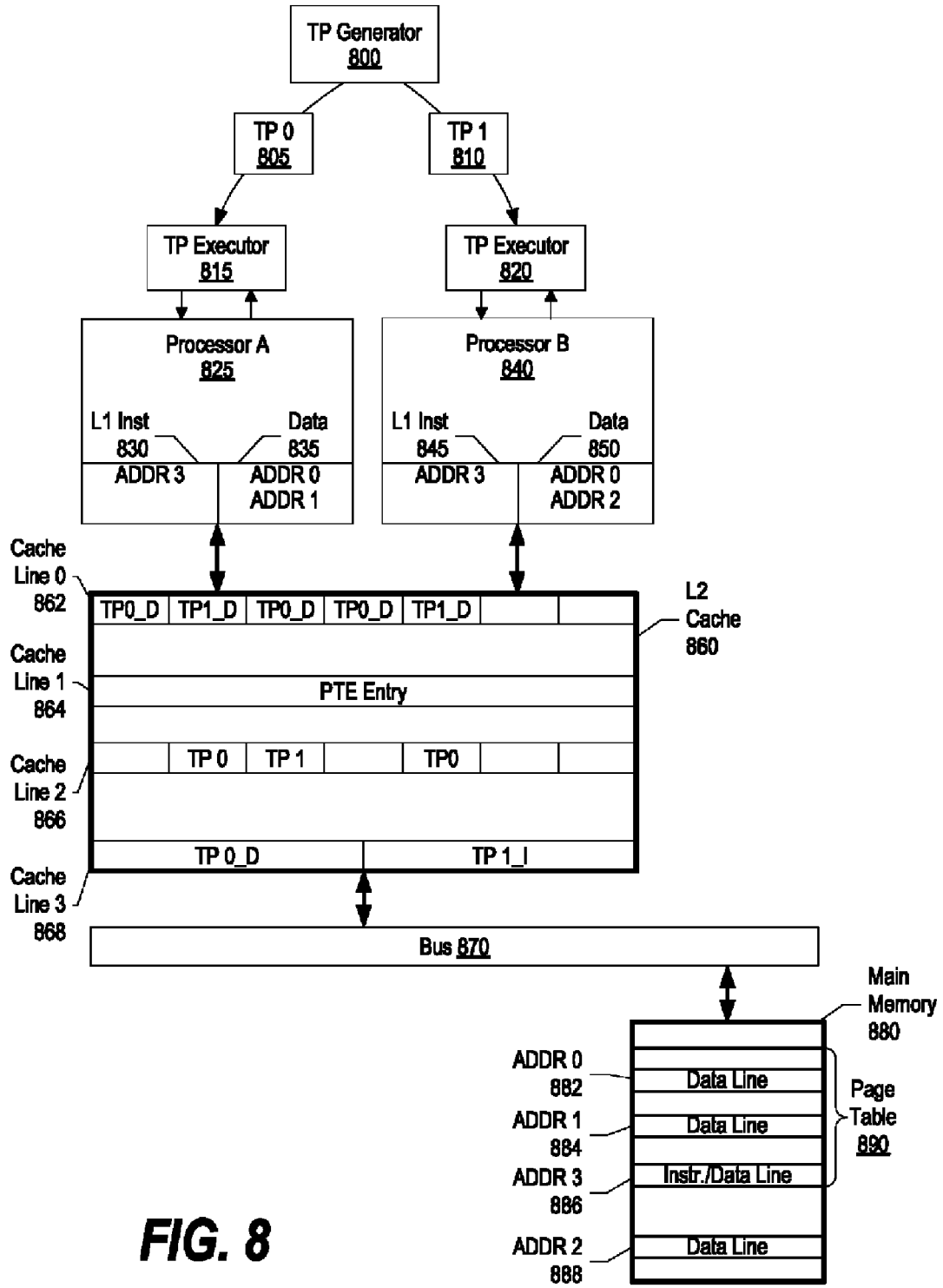
FIG. 8 is a diagram showing a test pattern generator generating test patterns that, when executed, provides interesting test scenarios by sharing page table memory for test pattern memory.

FIG. 8 is a diagram showing a test pattern generator generating test patterns that, when executed, provide interesting test scenarios by sharing page table memory for test pattern memory (e.g., instruction and data). A processor comprises sub units such as a cache, a TLB (translation look aside buffer), an SLB (segment look aside buffer), an MMU (memory management unit), etc. As such, Test pattern generator 800 generates test patterns in order to utilize memory in manner that is most effective for testing each of the sub units.

In addition to instruction memory, data memory is also shared across processors and test patterns. Since a processor's architectural rules may not specify that page table memory is restricted to only translation purposes, the test patterns are generated in order to test conditions when the page table memory is used for purposes other than translation.

Test pattern generator 800 generates test pattern 0 805 and test pattern 1 810, which are provided to test pattern executor 815 and test pattern executor 820, respectively. In turn, test pattern executor 815 and test pattern executor 820 dispatch the test patterns to processor A 825 and processor B 840, respectively. Test pattern 0 805 and test pattern 1 810 are generated such that their memory is pseudo-randomly allocated. As a result, the memory is distributed across processors and across multiple test patterns (in a case of N test patterns per processor).

When processor A 825 executes test pattern 0 805, instruction cache 830 includes "ADDR 3" and data cache 835 includes "ADDR 0" and "ADDR 1." Similarly, when processor B 840 executes test pattern 1 810, instruction cache 845 includes "ADDR 3" and data cache 850 includes "ADDR 0" and "ADDR 2."

As such, as can be seen in L2 cache 860, cache line 0 862 includes information pertaining to test pattern 0 805 as well as test pattern 1 810, which is pulled from address 0 882 in main memory 880 over bus 870. Cache line 1 864 includes page table entry information that is pulled from address 1 884 in main memory 880. Cache line 2 866 includes information pertaining to test pattern 0 805 as well as test pattern 1 810, which is pulled from address 2 888 in main memory 880. And, cache line 3 868 includes information pertaining to test pattern 0 805 as well as test pattern 1 810, which is pulled from address 3 886 in main memory 880.

On many occasions, when a test pattern is generated, a page table is not fully utilized. In such cases, the test patterns utilize the unused memory as DATA or instruction memory. As such, when the test pattern executes, an MMU may be updating the Page Table Entry (PTE) lines in cache at the same time another processor is updating the data memory in the same page that the PTE entry resides or accesses instruction memory.

Figure 9:
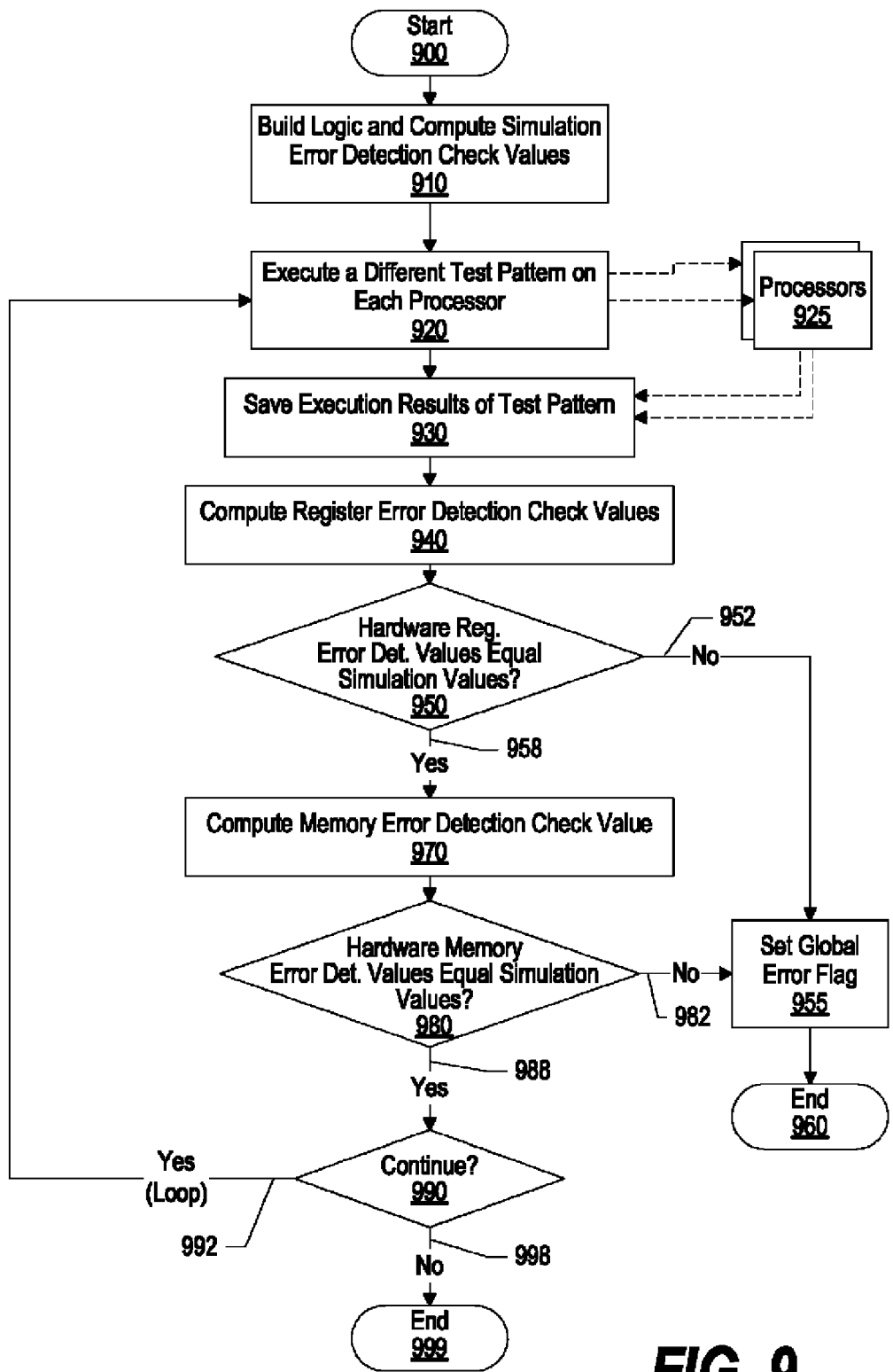
FIG. 9 is a flowchart showing steps taken in re-executing test patterns in varying timing scenarios.

FIG. 9 is a flowchart showing steps taken in re-executing test patterns in varying timing scenarios. The invention described herein verifies a processor by re-executing the same test pattern that results in the same final memory and register states in spite of different timing scenarios under which the execution occurs (see FIGS. 10-12 and corresponding text for further details).

Processing commences at 900, whereupon processing builds logic and computes simulation error detection check values based upon simulation results, such as simulation register error detection check values and simulation memory error detection check values (step 910). For example, the simulation error detection check values may be computed using a cyclic redundancy check (CRC). At step 920, processing executes a test pattern on each of processors 925 (different test pattern for each processor). Processing stores execution results from each of processors 925 at step 930.

Next, processing computes a hardware register error detection check value (e.g., CRC value) for each of processor 925 based upon their execution results (step 940), and a determination is made as to whether the hardware register error detection check values equal the simulation register error detection check values (decision 950). If the hardware register error detection check values do not equal the simulation register error detection check values, decision 950 branches to "No" branch 952 whereupon processing sets a global error flag (step 955) and ends at 960.

On the other hand, if the hardware register error detection check values equal the simulation register error detection check values, decision 950 branches to "Yes" branch 958 whereupon processing computes a hardware memory error detection check value (e.g. CRC value) at step 970.

A determination is made as to whether the hardware memory error detection check value matches the simulation memory detection check value (decision 980). If the hardware memory error detection check value does not match the simulation memory detection check value, decision 980 branches to "No" branch 982 whereupon processing sets a global error flag at step 955, and ends at 960. On the other hand, if the hardware memory error detection check value matches the simulation memory detection check value, decision 980 branches to "Yes" branch 988.

A determination is made as to whether to continue processor verification at decision 790. For example, system verification may require each test pattern to execute 100 times on its respective processor. If processor verification is to continue, decision 990 branches to "Yes" branch 992, which loops back to 920, whereupon a test pattern from each of the test pattern sets is selected to execute on its respective processor. This looping continues until processor verification should terminate, at which point decision 990 branches to "No" branch 998 whereupon processing ends at 999.

Figure 10:
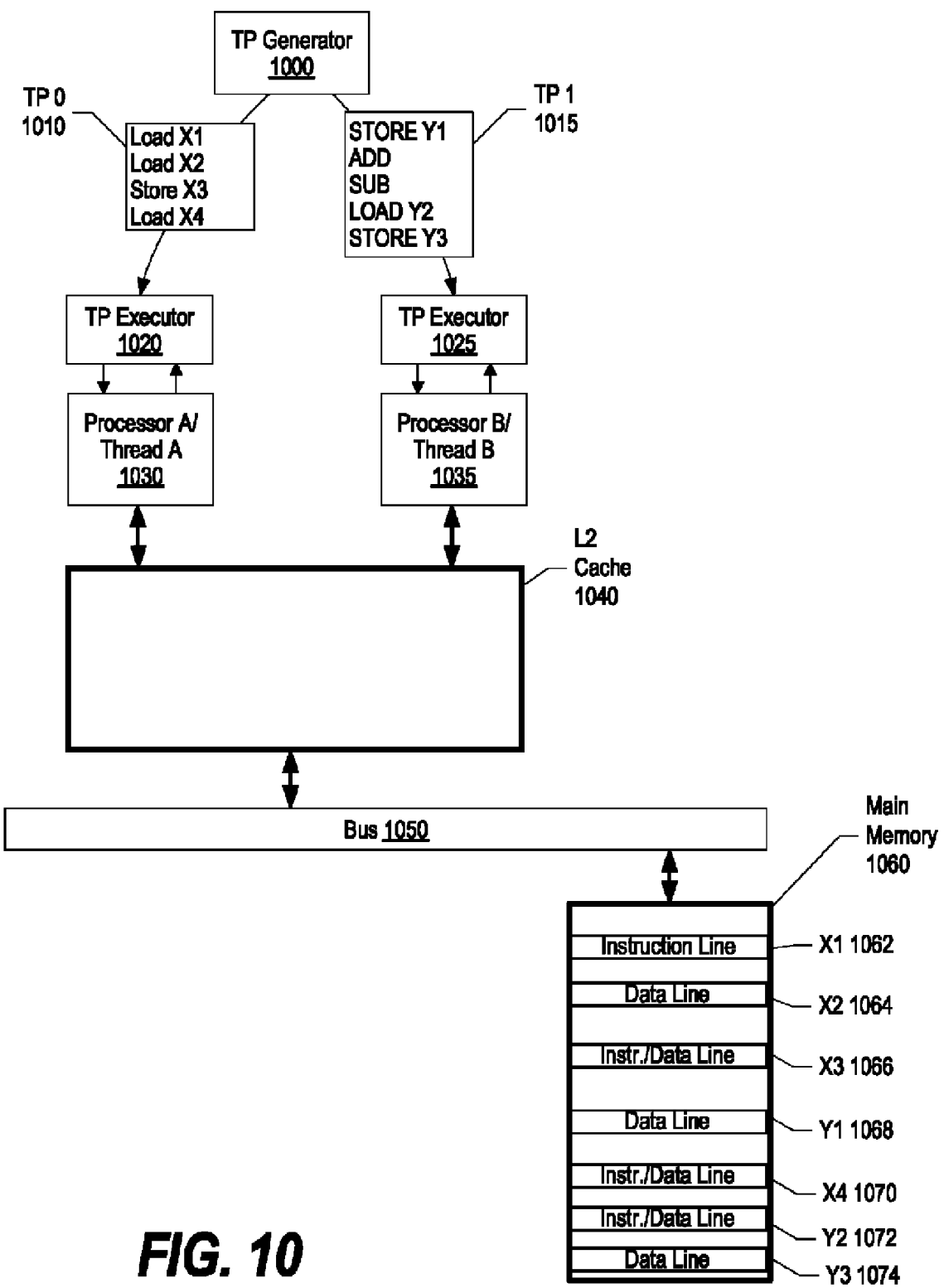
FIG. 10 is a diagram showing an L2 cache's initial state prior to a test pattern execution.

FIG. 10 is a diagram showing an L2 cache's initial state prior to a test pattern execution. When a processor executes load-store instructions from a test pattern for a first time, the processor fetches the data from main memory. During the next re-execution, however, some data may already reside in cache depending upon the cache implementation. This provides different timing scenarios when a processor re-executes the same test pattern.

In a multi-processor scenario, a test pattern can be constructed using false sharing logic in which the processors do not share the same target memory address, but where the processors share the same cache lines in the cache. Thus, a test pattern with the same initial state may take a different course en route to completion or produce a different processor state under subsequent re-executions of the same test pattern. Even so, the processor memory and registers still result in the same final state (see FIGS. 11-12 and corresponding text for further details).

Test pattern generator 1000 generates test patterns 0 1010 and test pattern 1 1015, which are provided to test pattern executors 1020 and 1025, respectively. In turn, test pattern executor 1020 dispatches test pattern 0 1010 to processor A 1030, which executes the test pattern using thread A. And, test pattern executor 1025 dispatches test pattern 1 1015 to processor B 1035, which executes the test pattern using thread B. In one embodiment, a processor may not have threads, or one processor may have multiple threads. In this embodiment, each thread executes one test pattern.

Both threads use L2 cache 1040 as they transfer information to/from main memory 1060 through bus 1050 during test pattern execution. Main memory 1060 comprises lines X1 1062 through X4 1070 and Y1 1068 through Y3 1074, which include instruction and data information. Depending upon timing conditions, L2 cache 1040 will still include information pertaining to test pattern 0 1010 and test pattern 1 1015 at the end of their execution (see FIGS. 11-12 and corresponding text for further details).

Figure 11:
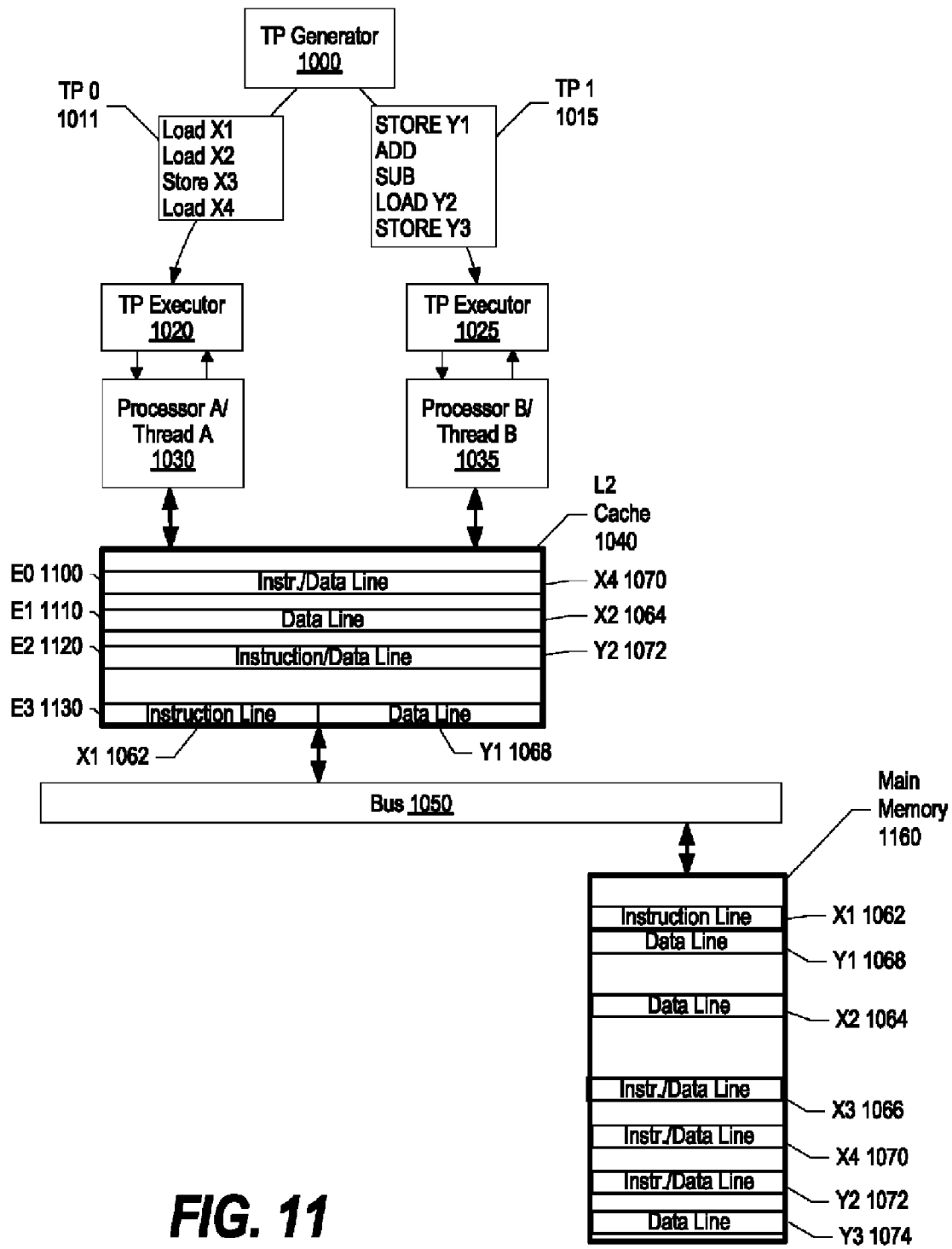
FIG. 11 is a diagram showing an L2 cache's state after executing test patterns on a plurality of processors a first round.

FIG. 11 is a diagram showing an L2 cache's state after executing test patterns on a plurality of processors a first round. FIG. 11 is similar to FIG. 10 with the exception that processor A 1030 and processor B 1035 have finished executing test pattern 0 1010 and test pattern 1 1015, respectively, for a first time.

After a first round of test pattern execution, L2 cache 1040 includes information in entries E0 1100 through E3 1130. Two lines "fit" into entry 1100 during test pattern execution, which are X4 1070 (from test pattern 0 1010) and Y3 1074 (from test pattern 1 1015). As can be seen, at the end of the first test pattern execution round, Y3 1074 is pulled in first, and then X4 1070, which is why X4 1070 remains in entry 0 1100 at the end of the execution. In other words, test pattern 0 1010's "load X4" was executed after test pattern 1 1015's "store Y3." This is due to the fact that memory line fetching from main memory 1060 to L2 cache 1040 takes few processor cycles, which results in instruction execution sequence changes across test patterns. In addition, as can be seen, entry 1 1110 includes X2 1064 information, entry 2 1120 includes Y2 1072's information, and entry 3 1130 includes information from both X1 1062 and Y1 1068. Therefore, during the next test pattern execution round, this information is not pulled from main memory 1060 because it already resides in L2 cache 1040, thus creating a different timing scenario.

Figure 12:
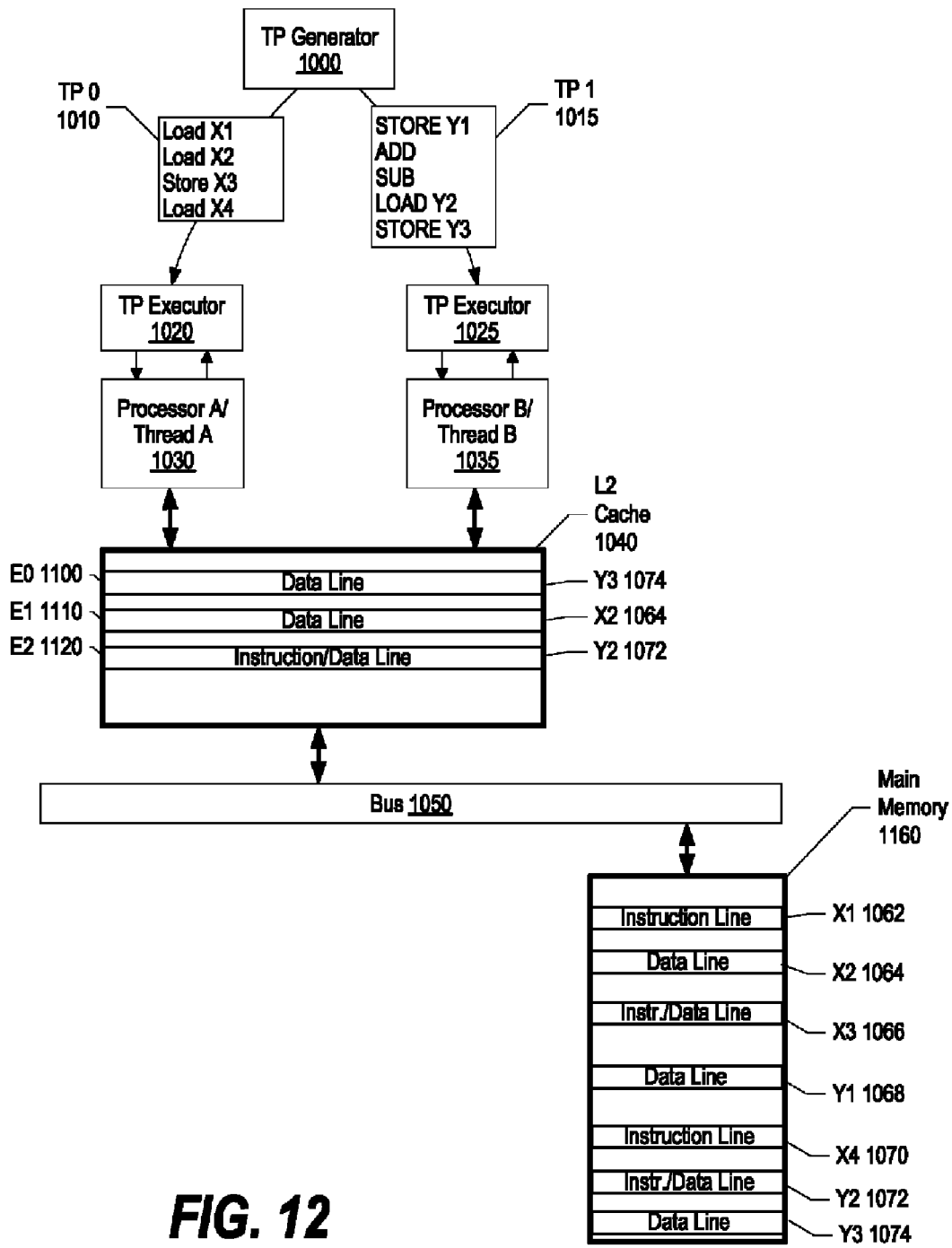
FIG. 12 is a diagram showing an L2 cache's state after executing test patterns on a plurality of processors a second round.

FIG. 12 is a diagram showing an L2 cache's state after executing test patterns on a plurality of processors a second round. FIG. 12 is similar to FIG. 11 with the exception that processor A 1030 and processor B 1035 have executed test pattern 0 1010 and test pattern 1 1015, respectively, for a second time.

After the second round of test pattern execution, L2 cache 1040 includes information in entries E0 1100 through E3 1130. At the end of the second round, however, Y3 1074 remains in E0 1100. This is due the fact that during the second test pattern execution round, X4 1070 is pulled in to entry E0 1100 first, and then Y3 1074. As a result, Y3 1074 remains in entry 0 1100 at the end of the second test pattern execution round, thus creating a different timing scenario for a third execution round.

Figure 13:
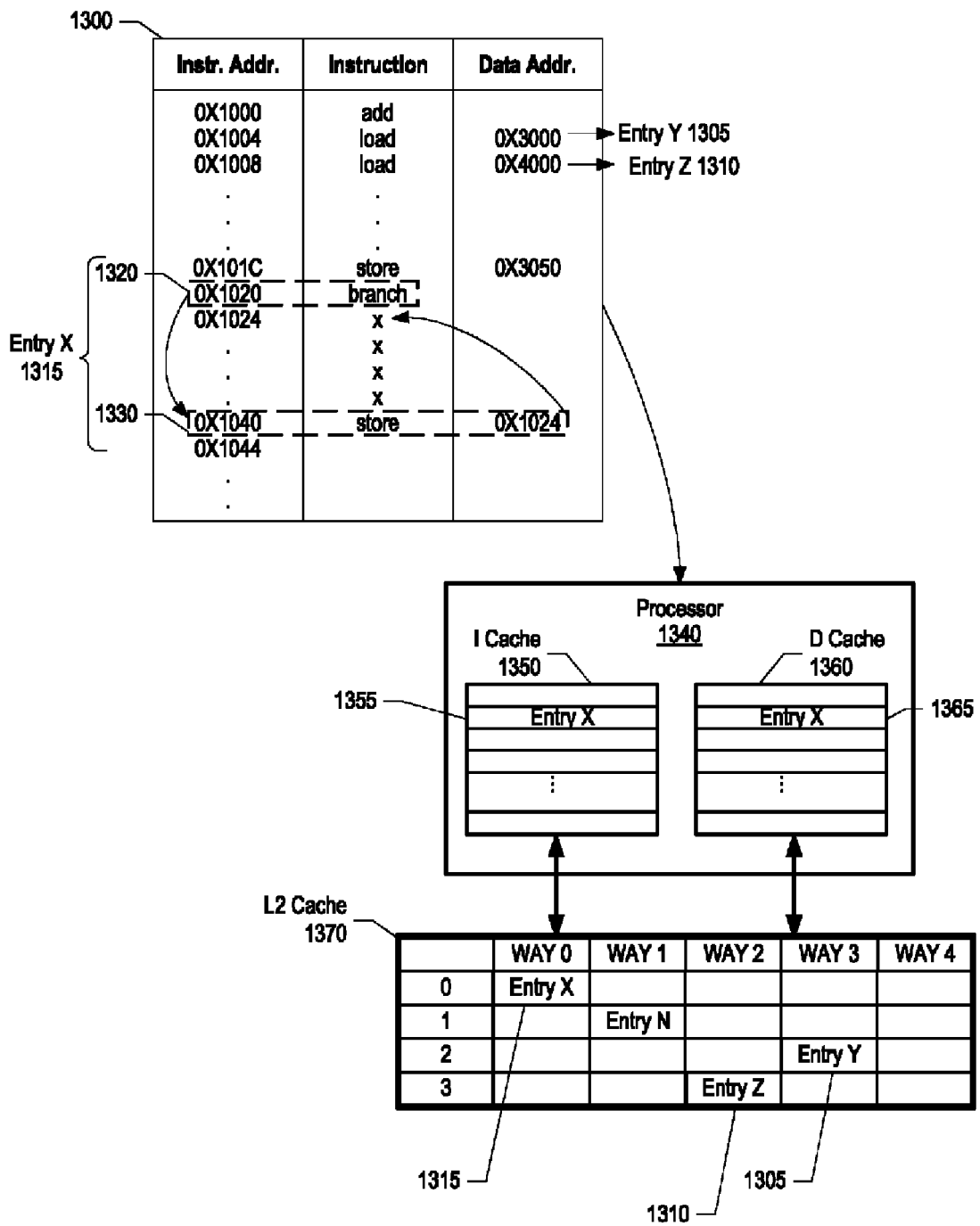
FIG. 13 is a diagram showing cache snoop logic and coherency verification between an instruction cache (icache) and a data cache (dcache)

FIG. 13 is a diagram showing cache snoop logic and coherency verification between an instruction cache (icache) and a data cache (dcache). In general, test patterns use different cache lines for instructions and data even when they share the same page of memory. As such, a specific cache line may not reside in both instruction and data caches at the same time. In order to test the L1 instruction and data level coherency, the invention described herein simultaneously uses the same cache line as part of both icache 1350 and dcache 1360, both of which reside within processor 1340.

Instruction stream 1300 includes instructions that correspond to particular cache lines within L2 cache 1370, such as entry Y 1305, entry Z 1310, and entry X 1315. As can be seen, entry X 1315 corresponds to multiple instruction lines due to the fact that each entry (cache line) is larger than a single instruction.

Instruction stream 1300 includes branch instruction 1320, which branches to instruction 1330. By branching, instruction stream 1300 creates an instruction stream "hole" in entry X 1315 between instruction 1320 and instruction 1330. The instruction stream hole is an area within the instruction stream that is not currently utilized due to a branch instruction, which allows the invention described herein the ability to store data in memory corresponding to the instruction stream hole (discussed below).

When processor 1340 begins executing instruction 1330, processor 1340 pulls in the corresponding instruction line located in entry 1315 into icache line 1355 (located in icache 1350). In order to complete instruction 1330, processor 1340 also pulls in entry X 1315 into dcache 1360 at dcache line 1365 because the instruction is to store data in a location included in entry X 1315 (address 0X1024). Processor 1340 executes instruction 1330, which requires changes to data line 1365 since instruction 1330 targets an address location within the data line. However, data line 1365 is suppose to include the same information as icache line 1355 since they correspond to the same cache line. When snoop logic functions properly, the snoop logic identifies the discrepancy between icache line 1355 and dcache line 1365 and, as a result, icache 1350 invalidates icache line 1355 and retrieves a new updated line that includes the changes made when executing instruction 1330.

Figure 14:
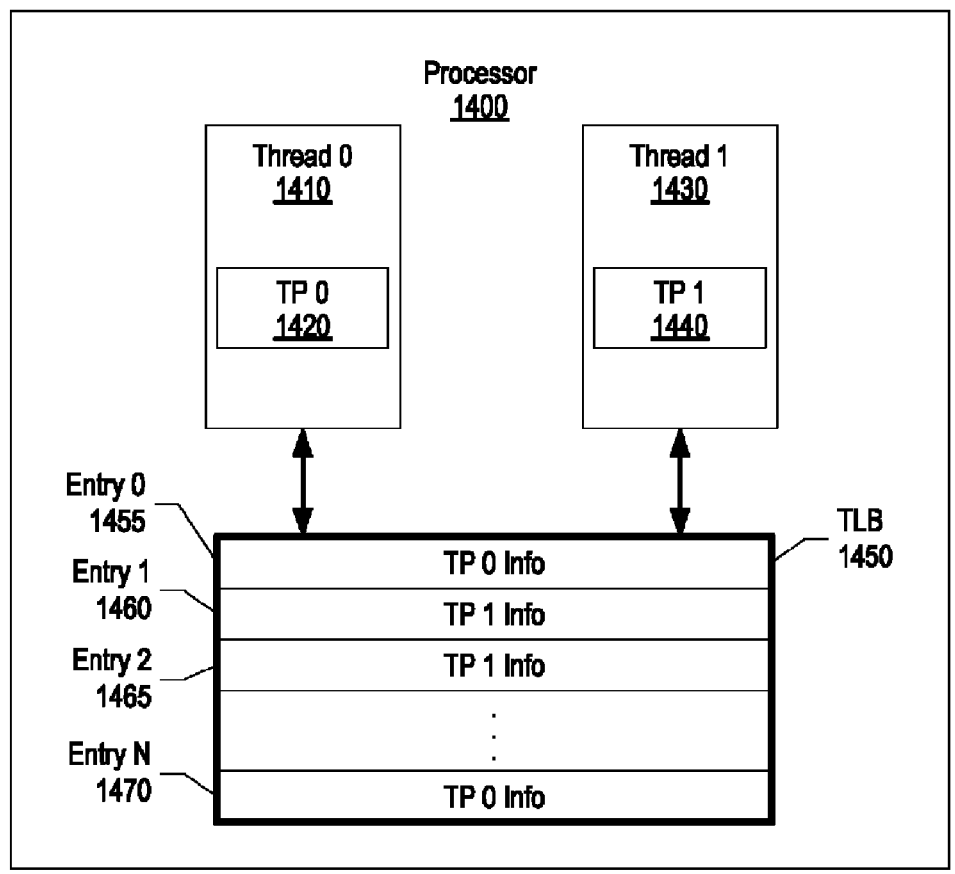
FIG. 14 is a diagram showing a processor executing multiple test patterns on multiple threads to quickly test each entry in a translation lookaside buffer (TLB)

FIG. 14 is a diagram showing a processor executing multiple test patterns that were generated in a manner to quickly test each entry in a translation lookaside buffer (TLB). Test patterns are generated in order to ensure that the test patterns cover an entire TLB region. During test pattern generation, new translations are created such that the translation corresponds to the next TLB entry in order for entire TLB coverage until each entry in TLB 1450 is occupied (see FIG. 16 and corresponding text for further details). As can be seen, when processor 1400 invokes thread 0 1410 and thread 1 1430 to execute test pattern 0 1420 and test pattern 1 1440, respectively, entry 0 1455 and entry N 1470 include translations corresponding to test pattern 0 1420 and entry 1 1460 and entry 2 1465 include translations corresponding to test pattern 1 1440.

Figure 15:
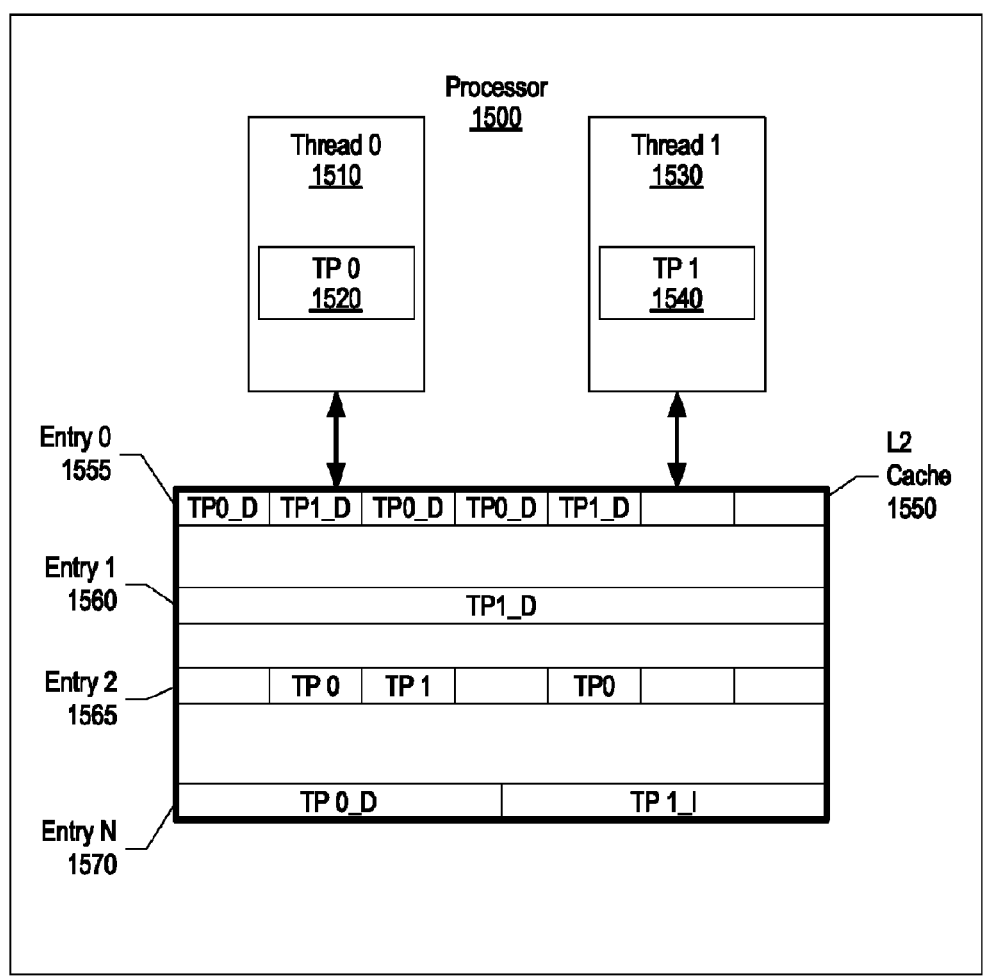
FIG. 15 is a diagram showing a processor executing multiple test patterns on multiple threads to fully test an L2 cache.

FIG. 15 is a diagram showing a processor executing multiple test patterns on multiple threads to fully test an L2 cache. Processor 1500 includes L2 cache 1550 that "holds" recently visited data and instructions, and is "close" to processor 1500's core for performance purposes. Typically, more than one unit (e.g., load/store unit, MMU etc.) accesses L2 cache 1550. In addition, threads usually share the same on-chip cache, such as thread 0 1510 and thread 1 1530. As such, L2 cache 1550 plays a crucial role in processor performance and, therefore, L2 cache 1550 verification is essential. The invention described herein provides an efficient way of testing each of L2 cache 1550's cache byte/sector/word, as well as coherency, when more than one unit (MMU, processor, threads, etc.) compete for a cache line.

When more than one thread accesses a cache, the invention described herein implements "false sharing" in order for two different threads to share the same cache line, but different bytes/sectors/words within the same cache line. Similarly, to stress the coherency and create a race condition, page table memory and data memory are enabled for sharing so that an MMU (for page table) and a processor (for data) access the same cache line at the same time.

During execution, test pattern 0 1520 accesses one unit of a cache line (byte/half word/word) and test pattern 1 1540 accesses a different unit of the same cache line. In other words, the test patterns share the cache line but not the same unit (byte/word/sector). In turn, more bytes are covered in a less amount of time since they are false shared. As can be seen, entry 0 1555, entry 1 1560, and entry N 1570 include information pertaining to both test pattern 0 1520 and test pattern 1 1540. Entry 1 1560 includes information corresponding to test pattern 1 1540.

In addition, coherency and race condition tests are performed. For these tests, page table memory and data memory are shared between units. Therefore, both the MMU and the processor access the same cache line simultaneously. For example, the MMU may access the cache line for updating register/control bits and the processor may access the cache line to update data.

The embodiment shown in FIG. 15 is an embodiment where L2 cache 1550 is not shared between multiple processors. In another embodiment, however, multiple processors may share L2 cache 1550, which results in more test patterns covering L2 cache 1550.

Figure 16:
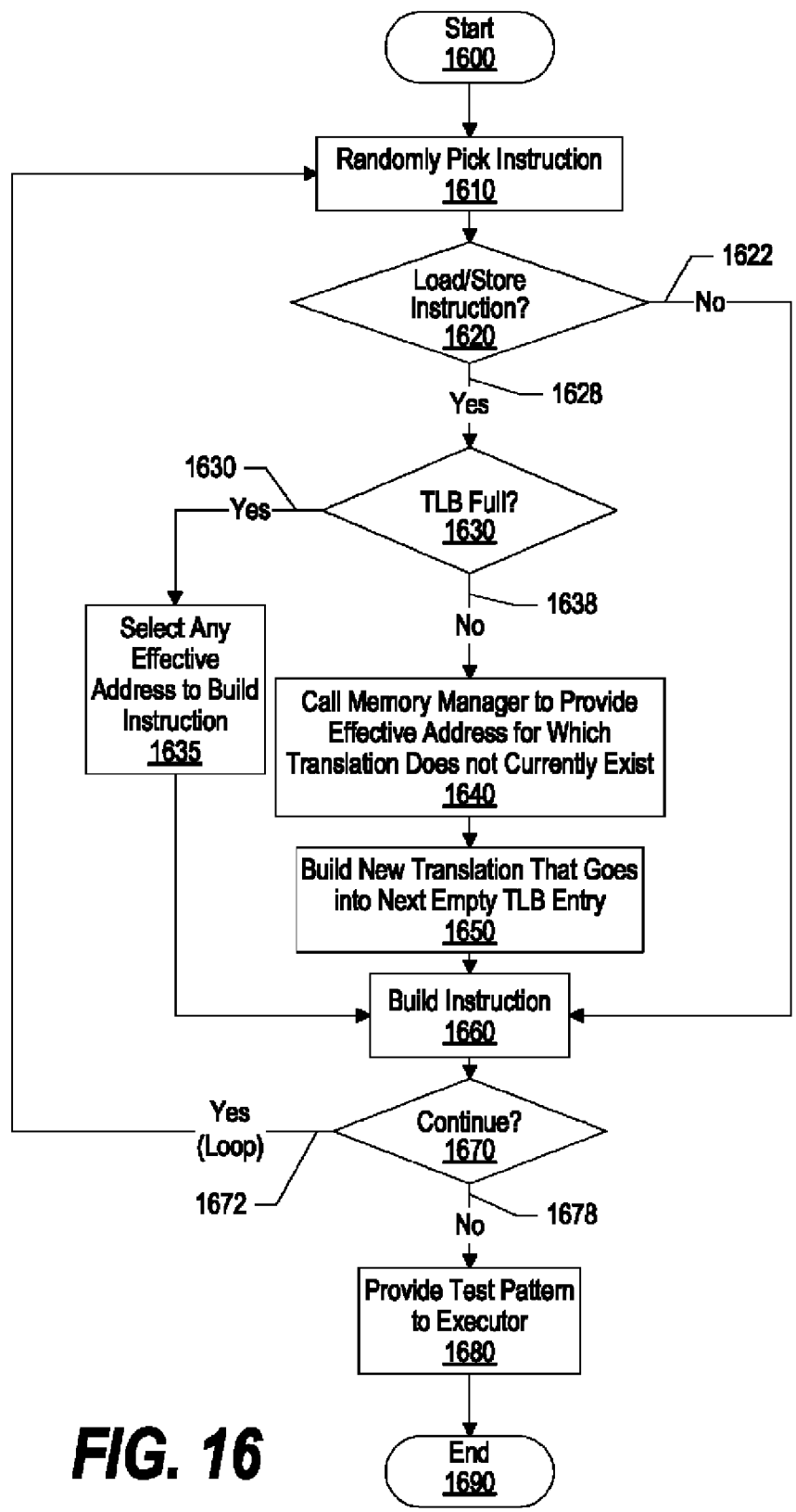
FIG. 16 is a flowchart showing steps taken in testing an entire TLB memory.

FIG. 16 is a flowchart showing steps taken in testing an entire TLB memory. The invention described herein creates new translations corresponding to unoccupied TLB entries until each entry is occupied in order to provide full test coverage of the TLB. As those skilled in the art can appreciate, FIG. 16 represents building both data and instruction translations.

Processing commences at 1600, whereupon processing randomly picks an instruction from the set/pool of instructions defined by architectural details for the processor to include in a test pattern (step 1610). A determination is made as to whether the instruction is a load/store instruction (decision 1620). If the unit is not a load/store instruction, decision 1620 branches to "No" branch 1622 whereupon processing builds the instruction at step 1660.

On the other hand, if the instruction is a load/store instruction, decision 1620 branches to "Yes" branch 1628 whereupon a determination is made as to whether the TLB is full (decision 1630). If the TLB is full, signifying that the TLB is fully covered, decision 1630 branches to "Yes" branch 1632 whereupon processing selects any effective address and translation to build the load/store instruction at step 1635, and builds the instruction at step 1660.

On the other hand, if the TLB is not full, decision 1630 branches to "No" branch 1638 whereupon processing calls a memory manager to provide an effective address for which a translation does not currently exist (step 1640). At step 1650, processing builds a new translation using the provided address, which loads into the next empty TLB entry. At step 1660, processing then builds the load/store instruction.

A determination is made as to whether to continue to create the test pattern (decision 1670). If processing should continue to create the test pattern, decision 1670 branches to "Yes" branch 1672 which loops back to randomly pick and process another instruction. This looping continues until processing should terminate test pattern generation, at which point decision 1670 branches to "No" branch 1678 whereupon processing provides the test pattern to a test pattern executor (step 1680), and processing ends at 1690.

Figure 17:
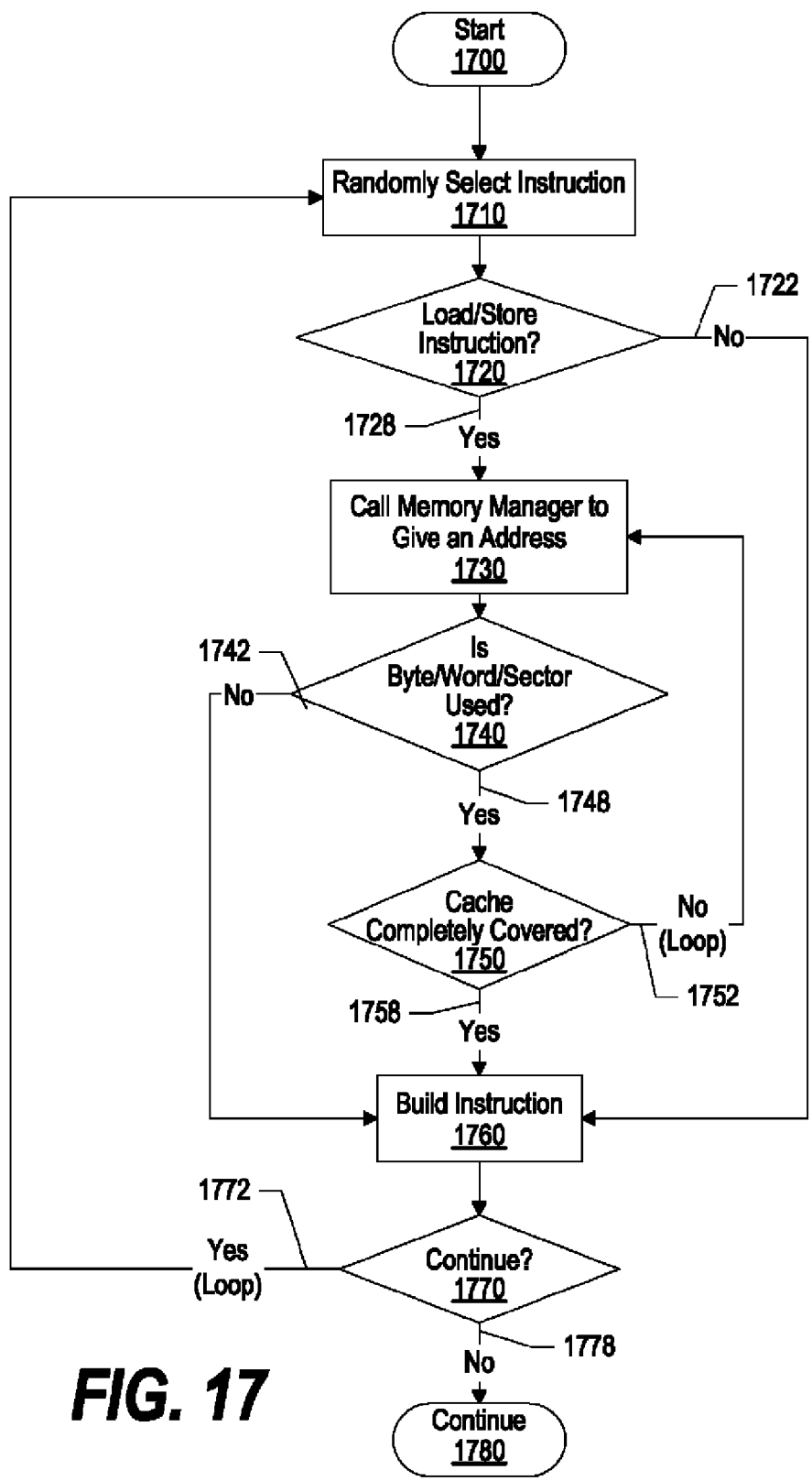
FIG. 17 is a flowchart showing steps taken in providing full test coverage of a cache.

FIG. 17 is a flowchart showing steps taken in providing full test coverage of a cache. Processing commences at 1700, whereupon processing randomly selects an instruction from a set/pool of instructions to include in a test pattern at step 1710. The set/pool of instructions are defined based upon architectural details of a particular processor. A determination is made as to whether the instruction is a load/store instruction (decision 1720). If the instruction is not a load/store instruction, decision 1720 branches to "No" branch 1722 whereupon processing builds the instruction at step 1760.

On the other hand, if the instruction is a load/store instruction, decision 1720 branches to "Yes" branch 1728 whereupon processing calls a memory manager to provide an address for the load/store instruction (step 1730). A determination is made as to whether the byte/word/sector corresponding to the address is already used by another instruction (decision 1740). If the byte/word/sector is not already used, decision 1740 branches to "No" branch 1742 whereupon processing builds the instruction using the supplied address at step 1760.

On the other hand, if the byte is already used by another instruction, decision 1740 branches to "Yes" branch 1748 whereupon a determination is made as to whether the cache is completely covered (decision 1750). If the cache is not completely covered (bytes still empty), decision 1750 branches to "No" branch 1752, which loops back to call the memory manager to provide a different address. This looping continues until the cache is completely covered, at which point decision 1750 branches to "Yes" branch 1758 whereupon processing builds the instruction using the provided address at step 1760.

A determination is made as to whether to continue test pattern generation (decision 1770). If test pattern generation should continue, decision 1770 branches to "Yes" branch 1772, which loops back to select and process another instruction. This looping continues until processing should terminate test pattern generation, at which point decision 1770 branches to "No" branch 1778 whereupon processing ends at 1780.

Figure 18:
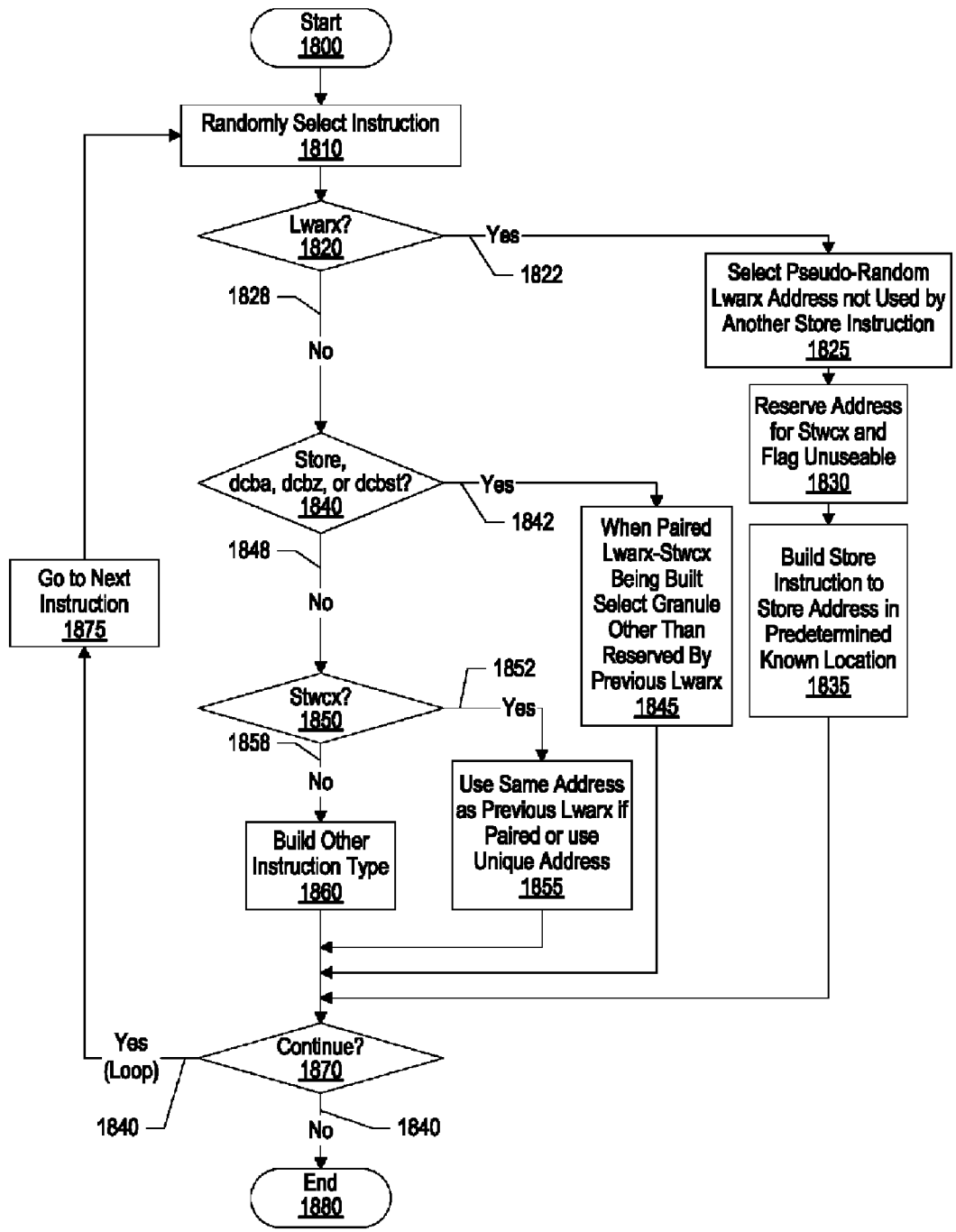
FIG. 18 is a flowchart showing steps taken in generating test patterns to test lwarx and stwcx instructions.

FIG. 18 is a flowchart showing steps taken in generating test patterns to test lwarx (Load Word And Reserve Index form) and stwcx (Store Word Conditional) instructions. A lwarx instruction establishes a reservation on an address/granule, and a stwcx instruction targeted to the same address/granule "succeeds" only if the reservation for the granule still exists (conditional store). Since the reservation may be lost due to situations such as, for example, a processor (or another processor) executing a another lwarx or ldarx (Load Double Word And Reserve Index form) instruction, which clears the first reservation and establishes a new reservation, the invention described herein builds test patterns in a manner that ensures, stwcx success/failure predictability. As a result, stwcx instructions are testable during test pattern execution (see FIG. 19 for further details).

Processing commences at 1800, whereupon processing randomly selects an instruction from a set/pool of instructions to include in a test pattern at step 1810. The set/pool of instructions are defined based upon architectural details of a particular processor. A determination is made as to whether the selected instruction is a lwarx instruction (decision 1820). A lwarx instruction creates a reservation in the processor for use by a stwcx instruction. If a reservation exists and the storage location specified by the stwcx is the same as that specified by the Load and Reserve instruction lwarx that established the reservation, the data is stored at the address by the stwcx instruction and the reservation is cleared. Otherwise, the reservation is cleared and no store is performed.

If the selected instruction is a lwarx instruction, decision 1820 branches to "Yes" branch 1822 whereupon processing selects a random address/granule that is not used by another store instruction for the lwarx instruction (step 1825), and reserves the selected address/granule for an upcoming paired stwcx instruction and marks it unusable by any other store instruction, other processor, or mechanism (step 1830). At step 1835, builds a store instruction that stores the pseudo-random address in a predetermined memory location. Processing performs this step in order allow an interrupt service routine to restore the reservation when an interrupt occurs before the corresponding stwcx occurs (see FIGS. 24, 25, and corresponding text for further details).

On the other hand, if the selected instruction is not a lwarx instruction, decision 1820 branches to "No" branch 1828 whereupon a determination is made as to whether the selected instruction is a dcba instruction, a dcbz instruction, or a dcbst instruction. A dcba (data cache block allocate) instruction, a dcbz (data cache block to zeros) instruction, and a dcbst (data cache block to main storage) instruction are all types of cache management instructions. If the selected instruction is a dcba instruction, a dcbz instruction, or a dcbst instruction, decision 1840 branches to "Yes" branch 1842 whereupon processing identifies whether a paired lwarx-stwcx is in process of being built and, if so, processing selects an address/granule other than the granule reserved by the lwarx instruction. If no paired lwarx-stwcx is being built, processing selects an address/granule without limitations and builds the instruction (step 1845).

On the other hand, if the selected instruction is not a dcba, dcbz, or dcbst instruction, decision 1840 branches to "No" branch 1848 whereupon a determination is made as to whether the selected instruction is a stwcx instruction (decision 1850). If the selected instruction is not a stwcx instruction, decision 1850 branches to "Yes" branch 1852 whereupon processing, if the stwcx is paired with a lwarx instruction, uses an address/granule reserved by the paired lwarx instruction. If the stwcx instruction is not paired with a lwarx instruction, processing selects a unique address/granule for the stwcx instruction and builds the instruction. On the other hand, if the selected instruction is not a stwcx instruction, processing branches to "No" branch 1858 whereupon processing builds the selected instruction type.

A determination is made as to whether to continue to build the test pattern (decision 1870). If processing should continue to build the test pattern, decision 1870 branches to "Yes" branch 1872, which loops back to proceed to the next instruction (step 1875), and processes the instruction. This looping continues until processing should stop generating the test pattern, at which point decision 1870 branches to "No" branch 1878, whereupon processing ends at 1880.

Figure 19:
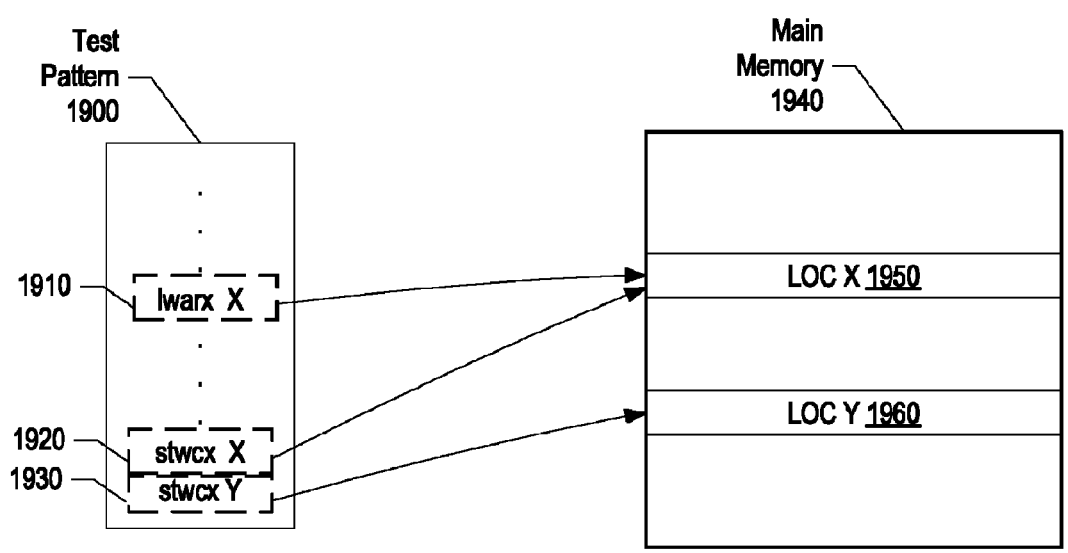
FIG. 19 is a diagram showing test pattern execution that includes paired lwarx-stwcx instructions in a non-interrupt mode.

FIG. 19 is a diagram showing test pattern execution that includes paired lwarx-stwcx instructions in a non-interrupt mode. In non-interrupt mode, stwcx failures are tested as well as stwcx successes. Since a stwcx instruction succeeds when a reservation exists for the particular granule reserved by a previous lwarx instruction, two scenarios exist in which stwcx success is predictable.

The first scenario is a "success case." A success case is when a stwcx instruction is built to succeed and has to be predicted for success/fail. In a multi-core system, difficulty arises when controlling other processors to access the same granule. To achieve this, the stwcx instruction is built such that it matches a previous lwarx address/granule. Other processors' test patterns are built in such a way that other processors cannot access that reserved granule. As a result, the granule is reserved for a particular core. In addition, no other instructions (stores, dcba, dcbst, etc.) are built in between a lwarx-stwcx instruction pair and, therefore, the stwcx instruction is built to succeed. Since the system is in a non-interrupt mode, no context switch occurs while executing the test pattern. Therefore, the stwcx instruction succeeds because the reservation is not lost. As such, the result is predictable.

The second scenario is a "failure case" when a stwcx instruction is designed to always fail, which still results in a predictable scenario. In order to achieve this predictable scenario, the stwcx instruction always executes on a different address/granule other than that of the paired lwarx instruction that established the reservation.

Test pattern 1900 includes instructions 1910 through 1930. Instructions 1910 and 1920 are paired with each other (first scenario), while instruction 1930 is not paired with any lwarx instruction (second scenario). As test pattern 1900 executes instruction 1910, instruction 1910 reserves location X 1950 in main memory 1940 for paired stwcx instruction 1920. As such, instruction 1920 performs a successful store into location X 1950. In contrast, instruction 1930 is not able to store information into location Y 1960 because it is not previously reserved by a paired lwarx instruction.

FIG. 20 is a table showing different test pattern execution scenarios that result in different bus contention scenarios. In a multi-processor scenario, processors share a front side bus and all transactions to the memory flow on the bus in which a bus arbiter determines the bus owner. As a result, bus contention exists. An arbitration algorithm, however, improves the performance of the bus. The invention described herein provides a method to stress the bus with different timings in a shorter timeframe by providing different memory accesses in a different order by influencing different cache state and TLB states using the same test patterns. By creating multiple test patterns for a multi-processor system, and repeatedly executing the test patterns without rebuilding the test patterns, enables a system to spend more time testing the bus and other functional units in the processor (e.g., fixed and floating point units, VMX units, load/store units, etc.) rather than building test patterns.

Table 2000 includes columns 2010 through 2040 and rows 2050 through 2080. Each of rows 2050 through 2080 represent a test pattern to execute on a first processor (processor A 2045), and each of columns 2010 through 2040 represent a test pattern to execute on a second processor (processor B 2005). The example shown in FIG. 1 shows that four test patterns are created (test patterns A, B, C, and D), which access the same memory and cache lines. As one skilled in the art can appreciate, more or less test patterns may be created than what is represented in FIG. 20.

Since each test pattern accesses the same memory and cache lines, the cache and TLB states are different at any given state based upon the test pattern sequence. Therefore, by creating different test pattern sequences, different start caches result and, therefore, different bus timings result.

For example, when test pattern B is executed on processor A 2045 (row 2060) and test pattern D is executed on processor B 2005 (column 2040), the row/column intersection shows that the TLB, L1, L2 and bus states correspond to a "B,D" state. In another example, when test pattern A is executed on processor A (row 2050) and test pattern C is executed on processor B (column 2030), the row/column intersection shows that the TLB, L1, L2 and bus states correspond to an "A,C" state. In short, by executing the same test patterns in a different order, different cache and TLB states result (i.e. different bus contentions), which are tested.

Figure 21:
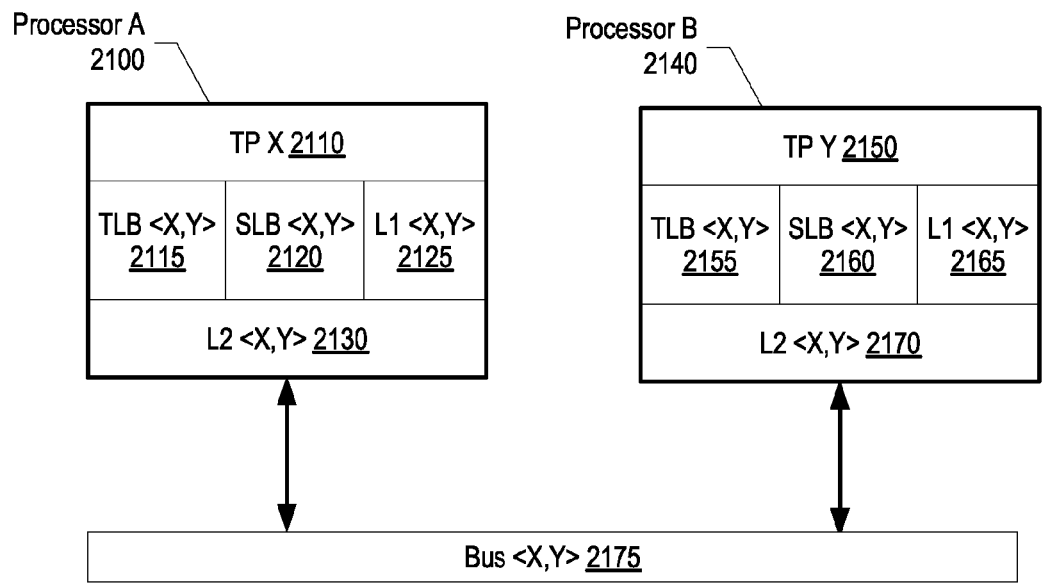
FIG. 21 is a diagram showing two processors executing two different test patterns, which results in a particular bus timing scenario and different states of functional units during execution.

FIG. 21 is a diagram showing two processors executing two different test patterns, which results in a particular bus timing scenario and different states of functional units during execution. Processor A 2100 executes test pattern X 2110 and processor B 2140 executes test pattern Y 2150. As such, TLB 2115, SLB 2120, L1 2125, L2 2130, TLB 2155, SLB 2160, L1 2165, L2 2170, and bus 2175 are in an "X,Y" state. When test pattern X 2110 executes on processor B 2140 and test pattern Y 2150 executes on processor A 2100, the states of the TLB's, SLB's, L1's, L2's and bus 2175 change to "Y,X." As can be seen, different test pattern combinations on two processors create different timing and state scenarios on the processor units and bus. As a result, the invention described herein allows processor logic and bus testing using a limited set of test patterns in a shorter time since numerous test patterns are not required to be built.

Figure 22:
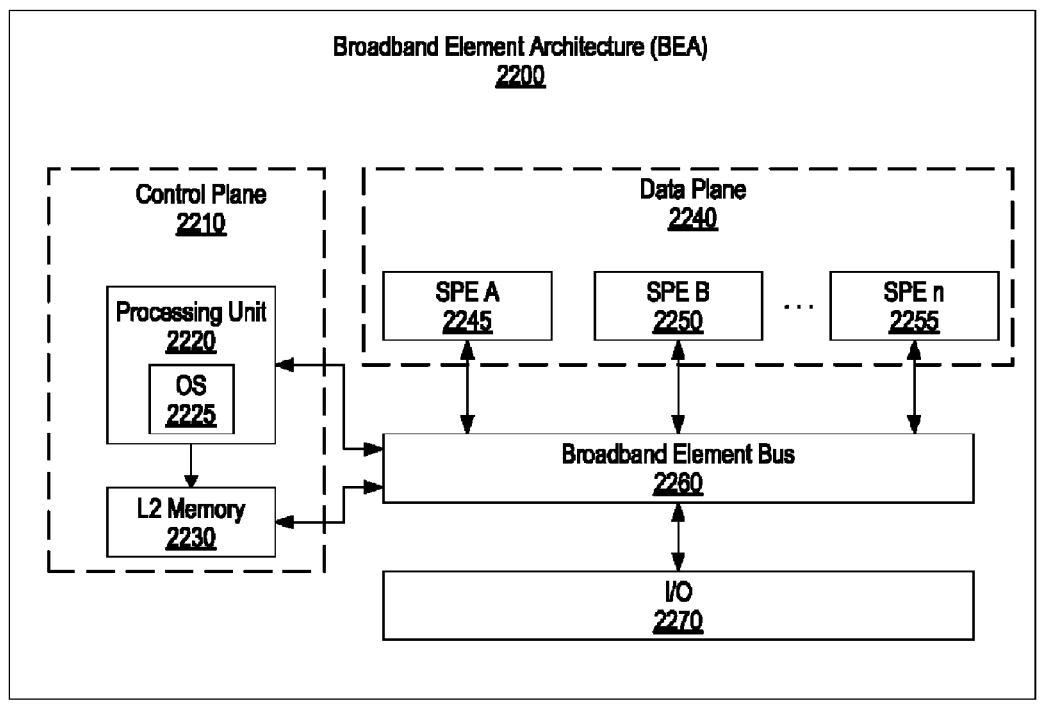
FIG. 22 is a diagram showing a broadband element architecture which includes a plurality of heterogeneous processors capable of implementing the invention described herein.

FIG. 22 is a diagram showing a broadband element architecture which includes a plurality of heterogeneous processors capable of implementing the invention described herein. The heterogeneous processors share a common memory and a common bus. Broadband element architecture (BEA) 2200 sends and receives information to/from external devices through input output 2270, and distributes the information to control plane 2210 and data plane 2240 using processor element bus 2260. Control plane 2210 manages BEA 2200 and distributes work to data plane 2240.

Control plane 2210 includes processing unit 2220 which runs operating system (OS) 2225. For example, processing unit 2220 may be a Power PC core that is embedded in BEA 2200 and OS 2225 may be a Linux operating system. Processing unit 2220 manages a common memory map table for BEA 2200. The memory map table corresponds to memory locations included in BEA 2200, such as L2 memory 2230 as well as non-private memory included in data plane 2240.

Data plane 2240 includes Synergistic processing element's (SPE) 2245, 2250, and 2255. Each SPE is used to process data information and each SPE may have different instruction sets. For example, BEA 2200 may be used in a wireless communications system and each SPE may be responsible for separate processing tasks, such as modulation, chip rate processing, encoding, and network interfacing. In another example, each SPE may have identical instruction sets and may be used in parallel to perform operations benefiting from parallel processes. Each SPE includes a synergistic processing unit (SPU) which is a processing core, such as a digital signal processor, a microcontroller, a microprocessor, or a combination of these cores.

SPE 2245, 2250, and 2255 are connected to processor element bus 2260, which passes information between control plane 2210, data plane 2240, and input/output 2270. Bus 2260 is an on-chip coherent multi-processor bus that passes information between I/O 2270, control plane 2210, and data plane 2240. Input/output 2270 includes flexible input-output logic which dynamically assigns interface pins to input output controllers based upon peripheral devices that are connected to BEA 2200.

Figure 23:
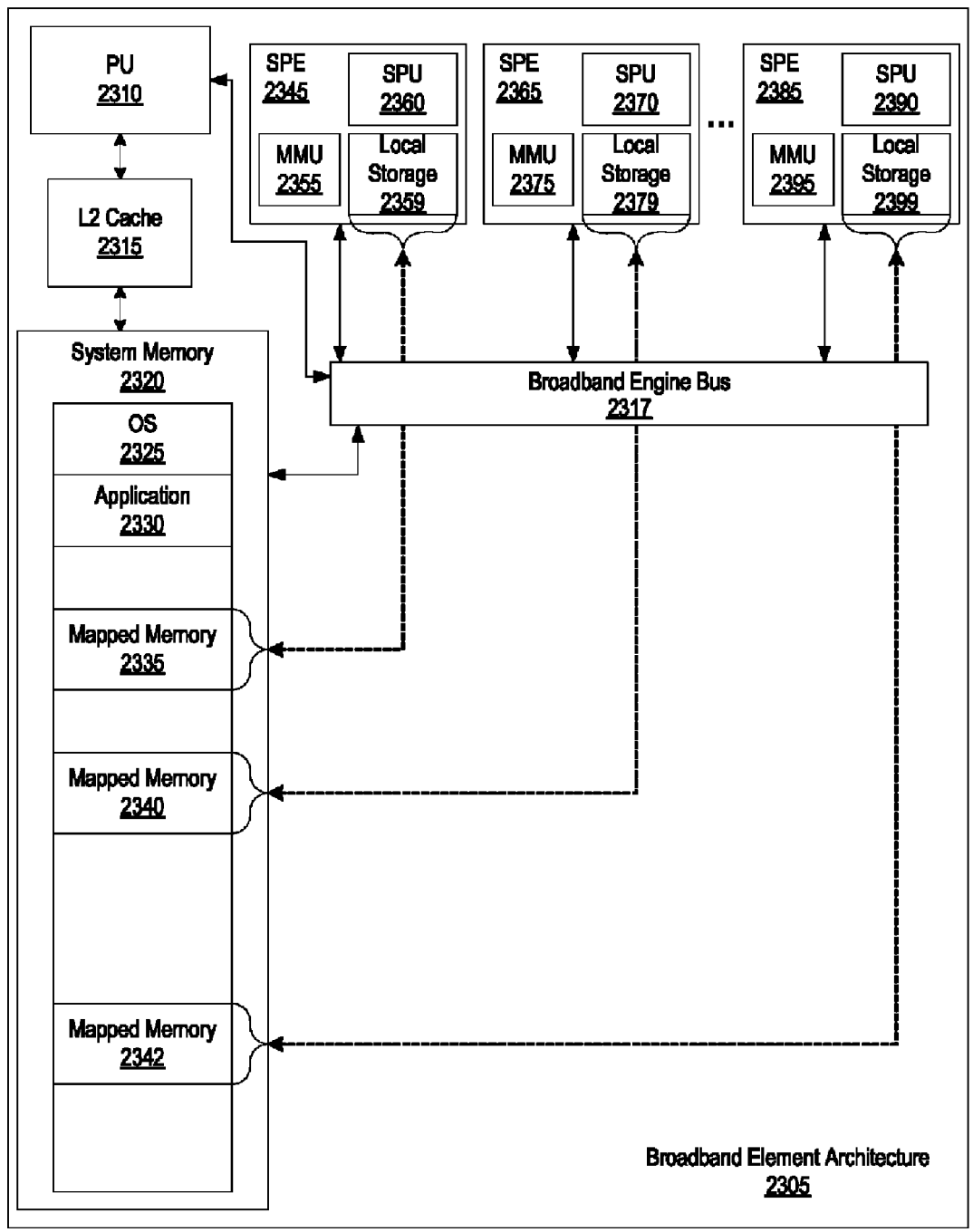
FIG. 23 is a block diagram illustrating a processing element having a main processor and a plurality of secondary processors sharing a system memory.

FIG. 23 is a block diagram illustrating a processing element having a main processor and a plurality of secondary processors sharing a system memory. Broadband Element Architecture (BEA) 2305 includes processing unit (PU) 2310, which, in one embodiment, acts as the main processor and runs the operating system. Processing unit 2310 may be, for example, a Power PC core executing a Linux operating system. BEA 2305 also includes a plurality of synergistic processing elements (SPEs) such as SPEs 2345 through 2385.

Each SPE includes a synergistic processing unit (SPU) that act as secondary processing units to PU 2310, a memory storage unit, and local storage. For example, SPE 2345 includes SPU 2360, MMU 2355, and local storage 2359; SPE 2365 includes SPU 2370, MMU 2375, and local storage 2379; and SPE 2385 includes SPU 2390, MMU 2395, and local storage 2399.

In one embodiment, the SPEs process data under the control of PU 2310. The SPEs may be, for example, digital signal processing cores, microprocessor cores, micro controller cores, etc., or a combination of the above cores. In one embodiment, each one of the local stores is a storage area associated with a particular SPU. Each SPU can configure its local store as a private storage area, a shared storage area, or an SPU's local store may be partly private and partly shared.

For example, if an SPU requires a substantial amount of local memory, the SPU may allocate 100% of its local store to private memory accessible only by that SPU. If, on the other hand, an SPU requires a minimal amount of local memory, the SPU may allocate 10% of its local store to private memory and the remaining 90% to shared memory. The shared memory is accessible by PU 2310 and by the other SPEs. An SPU may reserve part of its local store in order for the SPU to have fast, guaranteed access to some memory when performing tasks that require such fast access. The SPU may also reserve some of its local store as private when processing sensitive data, as is the case, for example, when the SPU is performing encryption/decryption.

The MMUs are responsible for transferring data between an SPU's local store and the system memory. In one embodiment, an MMU includes a direct memory access (DMA) controller configured to perform this function.

Each SPE may be set up to perform a different task, and accordingly, in one embodiment, each SPE may be accessed using different instruction sets. If BEA 2305 is being used in a wireless communications system, for example, each SPE may be responsible for separate processing tasks, such as modulation, chip rate processing, encoding, network interfacing, etc. In another embodiment, each SPE may have identical instruction sets and may be used in parallel to perform operations benefiting from parallel processes.

The shared portion of the SPEs' local stores may be accessed by PU 2310 as well as by the other SPEs by mapping each shared region to system memory 2320. In one embodiment, PU 2310 manages the memory map for the common system memory 2320. The memory map table may include PU 2310's L2 Cache 2315, system memory 2320, as well as the SPEs' shared local stores.

A portion of system memory 2320 as shown is occupied by the operating system (OS 2325). System Memory 2325 also contains data 2340, which represents data to be processed by SPU 2310 as well as by the SPEs. In one embodiment, a process executing on the PU receives a request for a task involving the processing of large data. The PU first determines an optimum method for performing the task as well as an optimum placement of the data in common system memory 2320. The PU may then initiate a transfer of the data to be processed from disk 2335 to system memory 2320. In one embodiment, the PU arranges the data in system memory 2325 in data blocks the size of the registers of the SPEs. In one embodiment, the SPEs may have 128 registers, each register being 128 bits long.

The PU then searches for available SPEs and assigns blocks of data to any available SPEs for processing of the data. The SPEs can access the common system memory (through a DMA command, for example) transfer the data to the SPEs' local store, and perform the assigned operations. After processing the data, the SPEs may transfer the data (using DMA again, for example) back to common system memory 2320. This procedure may be repeated as SPEs become available until all the data blocks have been processed.

Figure 24:
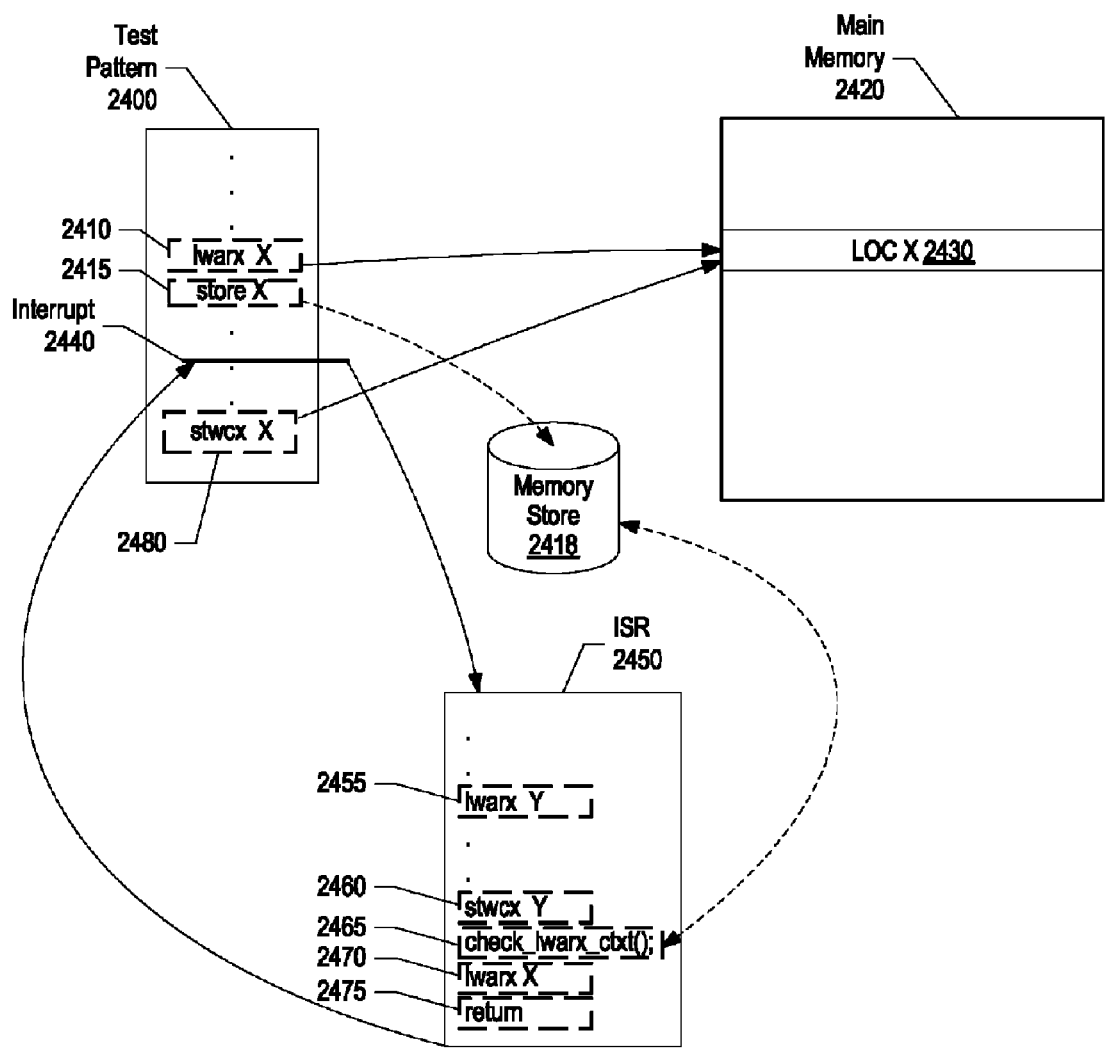
FIG. 24 is a diagram showing a test pattern executing, which includes paired lwarx-stwcx instructions, in an interrupt mode.

FIG. 24 is a diagram showing a test pattern executing, which includes paired lwarx-stwcx instructions, in an interrupt mode. Test pattern 2400 includes instructions 2410, 2415, and 2480. Lwarx instruction 2410 is paired with stwcx instruction 2480 and reserves memory location X 2430 for stwcx instruction 2480. The purpose of store instruction 2415 is to log the reserved address such that an interrupt service routine can restore the reservation after servicing an interrupt (see below).

Test pattern 2400 begins execution and reaches instruction 2410. Instruction 2410 reserves location X 2430 (located in main memory 2420) for paired stwcx instruction 2480. In addition, store instruction 2415 stores location X 2430 in a predetermined memory location located in memory store 2418 such that interrupt service routine 2450 can restore the reservation after servicing an interrupt.

FIG. 24 shows interrupt 2440 occurring before instruction 2480. In turn, interrupt service routine 2450 processes the interrupt and, while servicing the interrupt, the example shown in FIG. 24 shows that a different lwarx instruction (instruction 2455) reserves a different memory location, which is subsequently utilized by instruction 2460. At this point, instruction 2410's reservation is lost.

Interrupt service routine 2450 includes subroutine 2465 that determines whether to perform a lwarx instruction on a particular address is required in order to restore instruction 2410's reservation. In one embodiment, subroutine 2465 checks the predetermined memory location included in memory store 2418 and, when the value is non-zero, processing executes instruction 2470 using the non-zero value (in this case, address location x 2430), which restores the reservation for instruction 2480. In another embodiment, processing may check a flag in order to determine whether to perform a lwarx instruction on a particular address.

Interrupt service routine 2450 returns to test pattern 2400 at instruction 2475. In turn, instruction 2480 performs a successful store into location X 2430.

Figure 25:
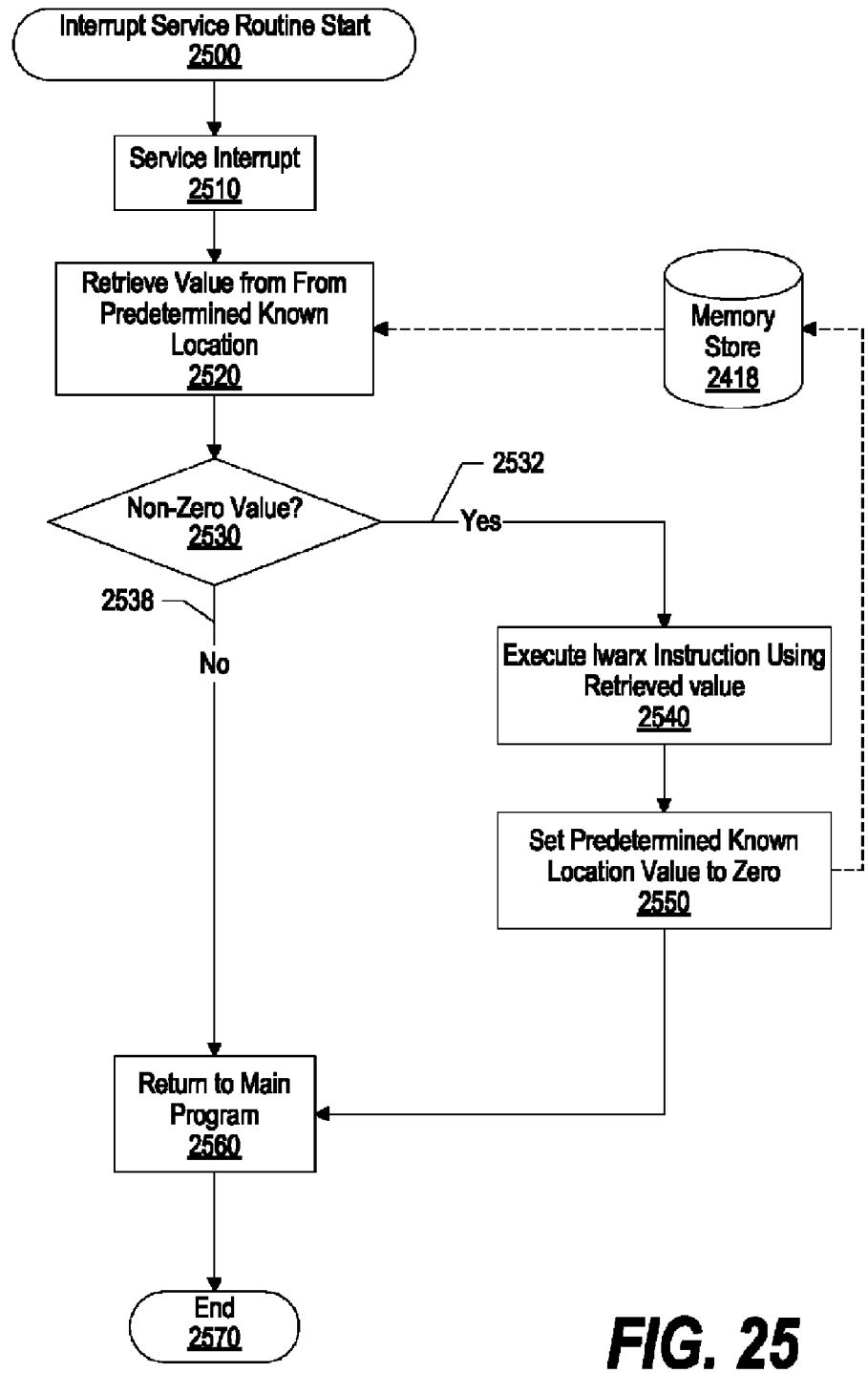
FIG. 25 is a flowchart showing steps taken in an interrupt service routine restoring a lwarx reservation after servicing an interrupt.

FIG. 25 is a flowchart showing steps taken in an embodiment of an interrupt service routine restoring a lwarx reservation after servicing an interrupt. Processing commences at 2500, whereupon processing services an interrupt that corresponds to a received interrupt request (step 2510). After servicing the interrupt, processing retrieves a value from a predetermined memory location located memory store 2418 (step 2520). Prior to the interrupt, a lwarx instruction may have reserved a memory location, in which case the memory location's address was stored in the predetermined memory location (see FIGS. 1, 24, and corresponding text for further details).

A determination is made as to whether the value is non-zero (decision 2530). If the value is zero, which indicates that a lwarx instruction did not reserve a memory location prior to the interrupt, decision 2530 branches to "No" branch 2530 whereupon processing returns to the main program at 2560 and the interrupt service routine ends at 2570.

On the other hand, if the value is non-zero, which indicates that a lwarx instruction had a reservation prior to the interrupt, processing branches to "Yes" branch 2532 whereupon processing executes a lwarx instruction using the retrieved memory address, which restores the reservation of the lwarx instruction prior to the interrupt (step 2540). At step 2550, processing sets the predetermined memory location value to zero and returns to the main program at step 2560. Interrupt service routine processing ends at 2570.

Figure 26:
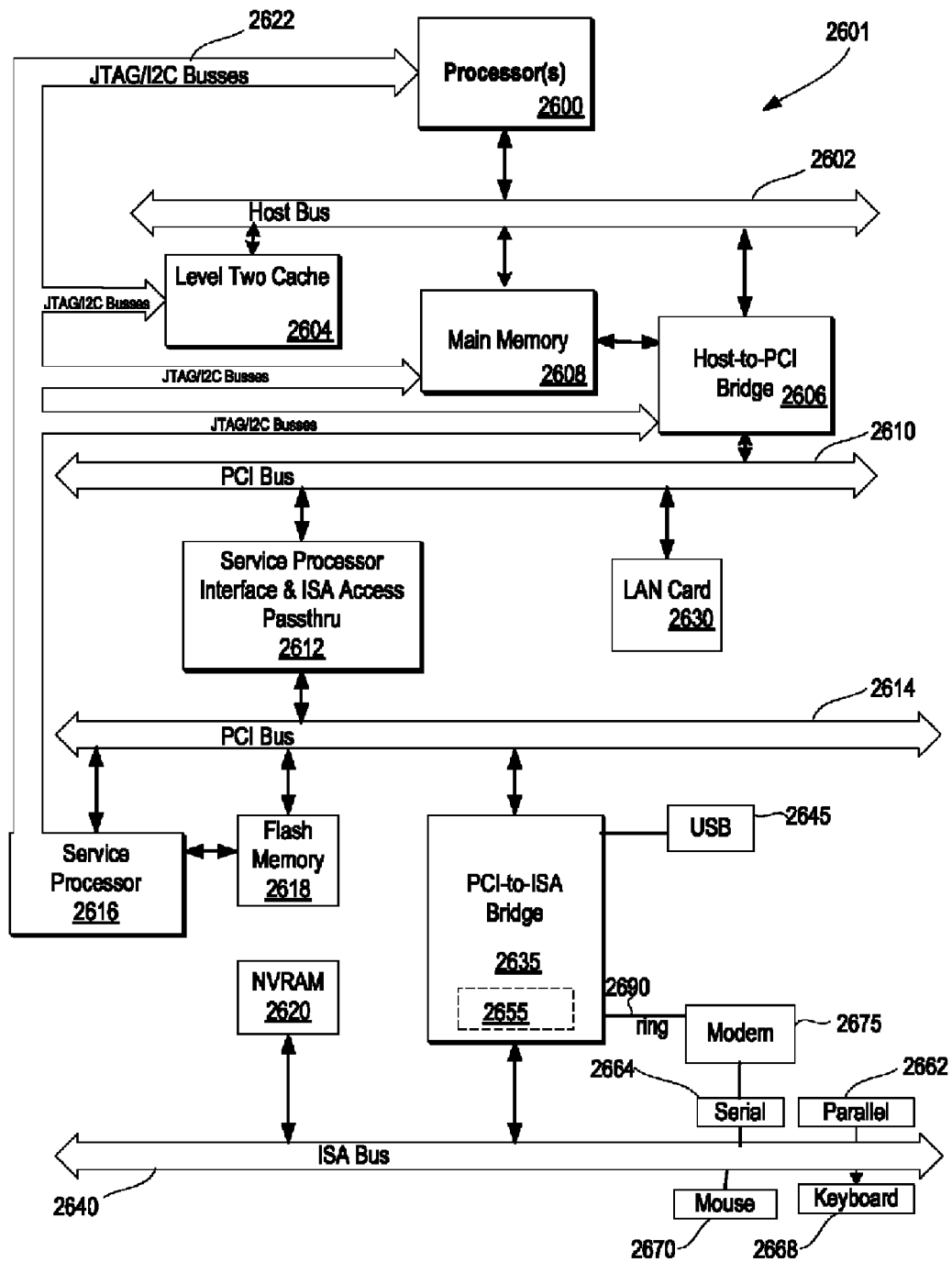
FIG. 26 illustrates a simplified example of a computer system capable of performing the computing operations described herein.

FIG. 26 illustrates information handling system 2601 which is a simplified example of a computer system capable of performing the computing operations described herein. Computer system 2601 includes processor 2600 which is coupled to host bus 2602. A level two (L2) cache memory 2604 is also coupled to host bus 2602. Host-to-PCI bridge 2606 is coupled to main memory 2608, includes cache memory and main memory control functions, and provides bus control to handle transfers among PCI bus 2610, processor 2600, L2 cache 2604, main memory 2608, and host bus 2602. Main memory 2608 is coupled to Host-to-PCI bridge 2606 as well as host bus 2602. Devices used solely by host processor(s) 2600, such as LAN card 2630, are coupled to PCI bus 2610. Service Processor Interface and ISA Access Pass-through 2612 provides an interface between PCI bus 2610 and PCI bus 2614. In this manner, PCI bus 2614 is insulated from PCI bus 2610. Devices, such as flash memory 2618, are coupled to PCI bus 2614. In one implementation, flash memory 2618 includes BIOS code that incorporates the necessary processor executable code for a variety of low-level system functions and system boot functions.

PCI bus 2614 provides an interface for a variety of devices that are shared by host processor(s) 2600 and Service Processor 2616 including, for example, flash memory 2618. PCI-to-ISA bridge 2635 provides bus control to handle transfers between PCI bus 2614 and ISA bus 2640, universal serial bus (USB) functionality 2645, power management functionality 2655, and can include other functional elements not shown, such as a real-time clock (RTC), DMA control, interrupt support, and system management bus support. Nonvolatile RAM 2620 is attached to ISA Bus 2640. Service Processor 2616 includes JTAG and I2C busses 2622 for communication with processor(s) 2600 during initialization steps. JTAG/I2C busses 2622 are also coupled to L2 cache 2604, Host-to-PCI bridge 2606, and main memory 2608 providing a communications path between the processor, the Service Processor, the L2 cache, the Host-to-PCI bridge, and the main memory. Service Processor 2616 also has access to system power resources for powering down information handling device 2601.

Peripheral devices and input/output (I/O) devices can be attached to various interfaces (e.g., parallel interface 2662, serial interface 2664, keyboard interface 2668, and mouse interface 2670 coupled to ISA bus 2640. Alternatively, many I/O devices can be accommodated by a super I/O controller (not shown) attached to ISA bus 2640.

In order to attach computer system 2601 to another computer system to copy files over a network, LAN card 2630 is coupled to PCI bus 2610. Similarly, to connect computer system 2601 to an ISP to connect to the Internet using a telephone line connection, modem 2675 is connected to serial port 2664 and PCI-to-ISA Bridge 2635.

While FIG. 26 shows one information handling system that employs processor(s) 2600, the information handling system may take many forms. For example, information handling system 2601 may take the form of a desktop, server, portable, laptop, notebook, or other form factor computer or data processing system. Information handling system 2601 may also take other form factors such as a personal digital assistant (PDA), a gaming device, ATM machine, a portable telephone device, a communication device or other devices that include a processor and memory.

One of the preferred implementations of the invention is a client application, namely, a set of instructions (program code) in a code module that may, for example, be resident in the random access memory of the computer. Until required by the computer, the set of instructions may be stored in another computer memory, for example, in a hard disk drive, or in a removable memory such as an optical disk (for eventual use in a CD ROM) or floppy disk (for eventual use in a floppy disk drive), or downloaded via the Internet or other computer network. Thus, the present invention may be implemented as a computer program product for use in a computer. In addition, although the various methods described are conveniently implemented in a general purpose computer selectively activated or reconfigured by software, one of ordinary skill in the art would also recognize that such methods may be carried out in hardware, in firmware, or in more specialized apparatus constructed to perform the required method steps.

While particular embodiments of the present invention have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A computer-implemented method for generating a test pattern, the method comprising:
    pseudo-randomly selecting an address;
    building a lwarx instruction with the pseudo-randomly selected address;
    including the lwarx instruction in a test pattern;
    building a store instruction with the pseudo-randomly selected address, wherein the store instruction, when executed, stores the pseudo-randomly selected address in a predetermined memory location;
    including the store instruction in the test pattern; and
    creating an interrupt service routine to service an interrupt issued subsequent to the execution of the store instruction, wherein the interrupt service routine is created to further perform steps comprising:
        after servicing the interrupt, checking the predetermined memory location;
        determining that the pseudo-randomly selected address is located in the predetermined memory location; and
        in response to determining that the pseudo-randomly selected address is located in the predetermined memory location, executing a subsequent lwarx instruction using the pseudo-randomly selected address.

2. The method of claim 1 further comprising:
    reserving the pseudo-random address for a stwcx instruction that is paired to the lwarx instruction;
    selecting the stwcx instruction; and building the stwcx instruction into the test pattern using the first pseudo-random address, wherein a conflicting instruction does not exist in the test pattern between the lwarx instruction and the stwcx instruction.

3. The method of claim 2 wherein the interrupt includes a different lwarx instruction that clears the reservation of the pseudo-randomly selected address for the stwcx instruction.

4. The method of claim 3 wherein the execution of the subsequent lwarx instruction re-reserves the pseudo-randomly selected address for the stwcx instruction.

5. The method of claim 2 wherein the conflicting instruction is selected from the group consisting of a different lwarx instruction, a different stwcx instruction, a dcba instruction, a dcbz instruction, and a dcbst instruction.

6. The method of claim 2 further comprising:
   prior to the selection of the pseudo-randomly selected address, detecting that the pseudo-randomly selected address is not allocated to a different stwcx instruction; and
   after the selection of the pseudo-randomly selected address, flagging the pseudo-randomly selected address for the stwcx instruction and flagging the pseudo-random address as unusable.

7. The method of claim 1 wherein the interrupt service routine further comprises:
   after executing the subsequent lwarx instruction using the pseudo-random address, setting a value of the predetermined memory location to zero.

8. A peripheral device comprising:
   one or more processors;
   a memory accessible by at least one of the processors;
   a nonvolatile storage area accessible by at least one of the processors;
   a set of instructions stored in the memory and executed by at least one of the processors in order to perform actions of:
      pseudo-randomly selecting an address;
      building a lwarx instruction with the pseudo-randomly selected address;
      including the lwarx instruction in a test pattern;
      building a store instruction with the pseudo-randomly selected address, wherein the store instruction, when executed, stores the pseudo-randomly selected address in a predetermined memory location;
      including the store instruction in the test pattern; and
      creating an interrupt service routine to service an interrupt issued subsequent to the execution of the store instruction, wherein the interrupt service routine is created to further perform steps comprising:
         after servicing the interrupt, checking the predetermined memory location;
         determining that the pseudo-randomly selected address is located in the predetermined memory location; and
         in response to determining that the pseudo-randomly selected address is located in the predetermined memory location, executing a subsequent lwarx instruction using the pseudo-randomly selected address.

9. The peripheral device of claim 8 wherein the set of instructions performs actions of:
   reserving the pseudo-random address for a stwcx instruction that is paired to the lwarx instruction;
   selecting the stwcx instruction; and
   building the stwcx instruction into the test pattern using the first pseudo-random address, wherein a conflicting instruction does not exist in the test pattern between the lwarx instruction and the stwcx instruction.

10. The peripheral device of claim 9 wherein the interrupt includes a different lwarx instruction that clears the reservation of the pseudo-randomly selected address for the stwcx instruction.

11. The peripheral device of claim 10 wherein the execution of the subsequent lwarx instruction re-reserves the pseudo-randomly selected address for the stwcx instruction.

12. The peripheral device of claim 9 wherein the conflicting instruction is selected from the group consisting of a different lwarx instruction, a different stwcx instruction, a dcba instruction, a dcbz instruction, and a dcbst instruction.

13. The peripheral device of claim 9 wherein the set of instructions performs actions of:
   prior to the selection of the pseudo-randomly selected address, detecting that the pseudo-randomly selected address is not allocated to a different stwcx instruction; and
   after the selection of the pseudo-randomly selected address, flagging the pseudo-randomly selected address for the stwcx instruction and flagging the pseudo-random address as unusable.

14. A computer program product stored in a computer readable medium, comprising functional descriptive material that, when executed by an information handling system, causes the information handling system to perform actions that include:
   pseudo-randomly selecting an address;
   building a lwarx instruction with the pseudo-randomly selected address;
   including the lwarx instruction in a test pattern;
   building a store instruction with the pseudo-randomly selected address, wherein the store instruction, when executed, stores the pseudo-randomly selected address in a predetermined memory location;
   including the store instruction in the test pattern; and
   creating an interrupt service routine to service an interrupt issued subsequent to the execution of the store instruction, wherein the interrupt service routine is created to further perform steps comprising:
      after servicing the interrupt, checking the predetermined memory location;
      determining that the pseudo-randomly selected address is located in the predetermined memory location; and
      in response to determining that the pseudo-randomly selected address is located in the predetermined memory location, executing a subsequent lwarx instruction using the pseudo-randomly selected address.

15. The computer program product of claim 14 wherein the information handling system further performs actions that include:
   reserving the pseudo-random address for a stwcx instruction that is paired to the lwarx instruction;
   selecting the stwcx instruction; and
   building the stwcx instruction into the test pattern using the first pseudo-random address, wherein a conflicting instruction does not exist in the test pattern between the lwarx instruction and the stwcx instruction.

16. The computer program product of claim 15 wherein the interrupt includes a different lwarx instruction that clears the reservation of the pseudo-randomly selected address for the stwcx instruction.

17. The computer program product of claim 16 wherein the execution of the subsequent lwarx instruction re-reserves the pseudo-randomly selected address for the stwcx instruction.

18. The computer program product of claim 15 wherein the conflicting instruction is selected from the group consisting of a different lwarx instruction, a different stwcx instruction, a dcba instruction, a dcbz instruction, and a dcbst instruction.

19. The computer program product of claim 15 wherein the information handling system further performs actions that include:

prior to the selection of the pseudo-randomly selected address, detecting that the pseudo-randomly selected address is not allocated to a different stwcx instruction; and after the selection of the pseudo-randomly selected address, flagging the pseudo-randomly selected address for the stwcx instruction and flagging the pseudo-random address as unusable.

20. The computer program product of claim 14 wherein the information handling system further performs actions that include:

after executing the subsequent lwarx instruction using the pseudo-random address, setting a value of the predetermined memory location to zero.

* * * * *